(12) United States Patent
Li et al.

(10) Patent No.: US 12,506,069 B2
(45) Date of Patent: Dec. 23, 2025

(54) SEMICONDUCTOR STRUCTURE HAVING FUSE BELOW GATE STRUCTURE AND METHOD OF MANUFACTURING THEREOF

(71) Applicant: NANYA TECHNOLOGY CORPORATION, New Taipei (TW)

(72) Inventors: Wei-Zhong Li, Taoyuan (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 413 days.

(21) Appl. No.: 17/891,421

(22) Filed: Aug. 19, 2022

(65) Prior Publication Data

US 2024/0063115 A1   Feb. 22, 2024

(51) Int. Cl.
| | |
|---|---|
| H01L 23/525 | (2006.01) |
| H01L 23/528 | (2006.01) |
| H10D 30/01 | (2025.01) |
| H10D 30/60 | (2025.01) |
| H10D 62/13 | (2025.01) |
| H10D 64/23 | (2025.01) |
| H10D 64/27 | (2025.01) |
| H10D 84/01 | (2025.01) |
| H10D 84/03 | (2025.01) |
| H10D 84/40 | (2025.01) |
| H10D 84/83 | (2025.01) |

(52) U.S. Cl.
CPC ...... *H01L 23/5256* (2013.01); *H01L 23/5283* (2013.01); *H10D 62/151* (2025.01); *H10D 64/258* (2025.01); *H10D 64/512* (2025.01); *H10D 84/0133* (2025.01); *H10D 84/0149* (2025.01); *H10D 84/0151* (2025.01); *H10D 84/038* (2025.01); *H10D 84/83* (2025.01)

(58) Field of Classification Search
CPC ............... H01L 23/5256; H01L 21/486; H01L 21/76898; H01L 23/481; H01L 23/5384; H01L 2225/06541; H10D 62/151; H10D 30/60; H10D 84/0133; H10D 64/258; H10D 84/0149; H10D 30/0223

See application file for complete search history.

(56) References Cited

U.S. PATENT DOCUMENTS

| | | |
|---|---|---|
| 4,933,739 A | 6/1990 | Harari |
| 8,921,173 B2 | 12/2014 | Levin et al. |
| 2012/0326227 A1* | 12/2012 | Burke ................ H10D 30/0295 438/270 |
| 2013/0302958 A1* | 11/2013 | Hossain ............. H10D 30/0295 438/270 |
| 2014/0167144 A1* | 6/2014 | Tsuchiko ............. H10D 64/252 257/329 |
| 2015/0001580 A1 | 1/2015 | Di Sarro et al. |

(Continued)

FOREIGN PATENT DOCUMENTS

| | | |
|---|---|---|
| TW | 202143495 A | 11/2021 |
| WO | WO1995012215 A1 | 5/1995 |

*Primary Examiner* — Sonya McCall-Shepard
(74) *Attorney, Agent, or Firm* — MUNCY, GEISSLER, OLDS & LOWE, P.C.

(57) ABSTRACT

The present disclosure provides a semiconductor structure. The semiconductor structure includes a substrate; a transistor disposed over the substrate; and a trench fuse disposed in the substrate and penetrating a source/drain (S/D) region of the transistor. A method for manufacturing the semiconductor structure is also provided.

17 Claims, 27 Drawing Sheets

(56) References Cited

U.S. PATENT DOCUMENTS

2015/0235945 A1 8/2015 Karihata et al.
2017/0179278 A1 6/2017 Baldwin et al.
2019/0287899 A1 9/2019 Nagai

* cited by examiner

SEMICONDUCTOR STRUCTURE HAVING FUSE BELOW GATE STRUCTURE AND METHOD OF MANUFACTURING THEREOF

TECHNICAL FIELD

The present disclosure relates to a semiconductor structure and a method of manufacturing the semiconductor structure. Particularly, the semiconductor structure includes a fuse structure in the substrate below a horizontal level of a gate structure of a transistor.

DISCUSSION OF THE BACKGROUND

As the semiconductor industry has progressed into advanced technology process nodes in pursuit of greater device density, it has reached an advanced precision of photolithography. In order to further reduce device sizes, dimensions of elements and distances between different elements have to be proportionally reduced. However, with the reductions in the dimensions of the elements and the distances between different elements, challenges of precise control of the dimensions and the distances have arisen. For instance, a fuse contact formed after formation of a transistor may contact a gate of the transistor due to small dimensions and limits of the photolithography, and issues of short circuit and fail function of a device may arise.

This Discussion of the Background section is provided for background information only. The statements in this Discussion of the Background are not an admission that the subject matter disclosed in this Discussion of the Background section constitute prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure. The semiconductor structure includes a substrate; a transistor disposed over the substrate; and a trench fuse disposed in the substrate and penetrating a source/drain (S/D) region of the transistor.

In some embodiments, the substrate includes an active area and an isolation surrounding the active area.

In some embodiments, the S/D region is disposed in the substrate and between a gate structure of the transistor and the isolation.

In some embodiments, the trench fuse is disposed between the isolation and a gate structure of the transistor.

In some embodiments, a distance between the trench fuse and the isolation is in a range of 0 to 60 nanometers.

In some embodiments, a depth of the trench fuse is less than a depth of the isolation.

In some embodiments, a depth of the trench fuse is in a range of 100 to 200 nanometers.

In some embodiments, the trench fuse includes: an oxide layer, lining the substrate; and a conductive stack, surrounded by the oxide layer.

In some embodiments, the conductive stack includes: a metal layer; a metallic nitride layer, disposed over the metal layer; and a semiconductive material layer, disposed over the metallic nitride layer.

In some embodiments, the trench fuse further includes a nitride layer, disposed over the conductive stack and surrounded by the oxide layer.

In some embodiments, a gate structure of the transistor includes a gate dielectric layer, a polysilicon layer and a tungsten layer sequentially arranged over the substrate.

In some embodiments, the semiconductor structure comprises: a contact, disposed over the substrate and electrically connected to the S/D region of the transistor.

In some embodiments, the S/D region of the transistor is a first S/D region, and the transistor further includes a second S/D region, wherein a width of the first S/D region is substantially greater than a width of the second S/D region.

Another aspect of the present disclosure provides a semiconductor structure. The semiconductor structure includes a substrate, including an active area and an isolation surrounding the active area; a transistor, disposed over the substrate and in the active area; and a conductive trench structure, disposed in the substrate and between a gate structure of the transistor and the isolation.

In some embodiments, the conductive trench structure is disposed in a peripheral region of a chip.

In some embodiments, the conductive trench structure includes a conductive stack and an oxide layer surrounding the conductive stack.

In some embodiments, the oxide layer is sandwiched between the conductive stack and the substrate.

In some embodiments, a portion of the oxide layer is surrounded by an S/D region of the transistor.

In some embodiments, the conductive trench structure is a first conductive trench structure, and the semiconductor structure further includes a second conductive trench structure disposed adjacent to the transistor opposite to the first conductive structure.

In some embodiments, the semiconductor structure further comprises: a contact, disposed over the substrate and electrically connected to the S/D region of the transistor.

Another aspect of the present disclosure provides a method for manufacturing a semiconductor structure. The method includes a number of operations. A substrate is provided, wherein the substrate includes an active area and an isolation surrounding the active area. A trench fuse is formed in the active area. A gate structure of a transistor is formed over the substrate adjacent to the trench fuse. A doped region is formed surrounding the trench fuse and the gate structure.

In some embodiments, a distance between the isolation and the trench fuse is less than a distance between the isolation and the gate structure.

In some embodiments, the providing of the substrate includes: implanting the substrate to form a well region; and forming the isolation to define the active area in the well region.

In some embodiments, the formation of the trench fuse includes: removing a portion of the substrate to form a trench; forming an oxide layer lining the trench; and forming a conductive stack in the trench.

In some embodiments, the formation of the conductive stack includes: forming a tungsten layer in the trench; forming a nitride layer over the tungsten layer; and forming a semiconductive material layer over the nitride layer.

In some embodiments, the formation of the trench fuse further includes: forming a dielectric layer over the conductive stack in the trench.

In some embodiments, the conductive stack is formed concurrently with formation of a word line structure of the semiconductor structure.

In some embodiments, the formation of the gate structure includes: forming a dielectric layer over the substrate;

forming a gate material layer over the dielectric layer; and forming a conductive layer over the gate material layer.

In some embodiments, the formation of the gate structure further includes: forming a spacer structure surrounding the dielectric layer, the gate material layer and the conductive layer.

In some embodiments, the spacer structure includes a nitride layer between a first oxide layer and a second oxide layer.

In some embodiments, the doped region is formed in exposed portions of the substrate and defines source/drain regions of the transistor.

In some embodiments, the method further comprises: forming a contact over the substrate and electrically connected to the doped region.

In some embodiments, the contact is upright over the doped region.

In some embodiments, the contact contacts a spacer structure of the transistor.

In some embodiments, the trench fuse extends along a direction substantially perpendicular to an extending direction of the active area.

The foregoing has outlined rather broadly the features and technical advantages of the present disclosure in order that the detailed description of the disclosure that follows may be better understood. Additional features and technical advantages of the disclosure are described hereinafter, and form the subject of the claims of the disclosure. It should be appreciated by those skilled in the art that the concepts and specific embodiments disclosed may be utilized as a basis for modifying or designing other structures, or processes, for carrying out the purposes of the present disclosure. It should also be realized by those skilled in the art that such equivalent constructions do not depart from the spirit or scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
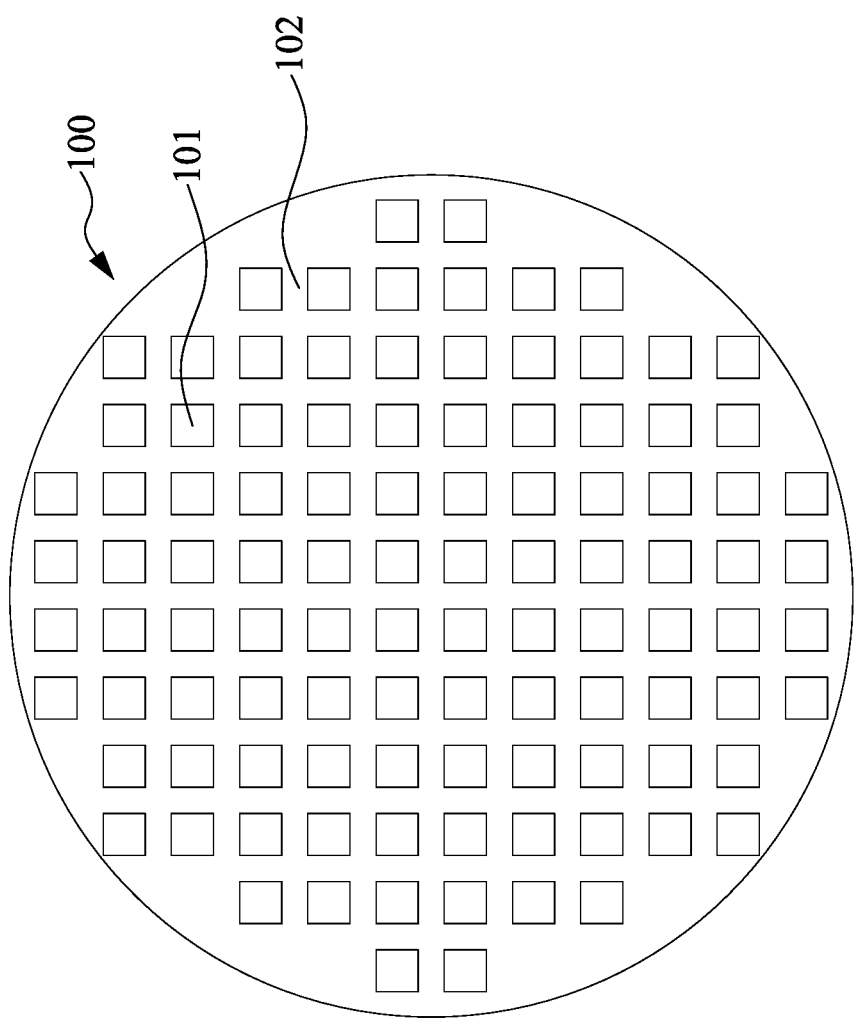
FIG. 1 is a top view of a wafer in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
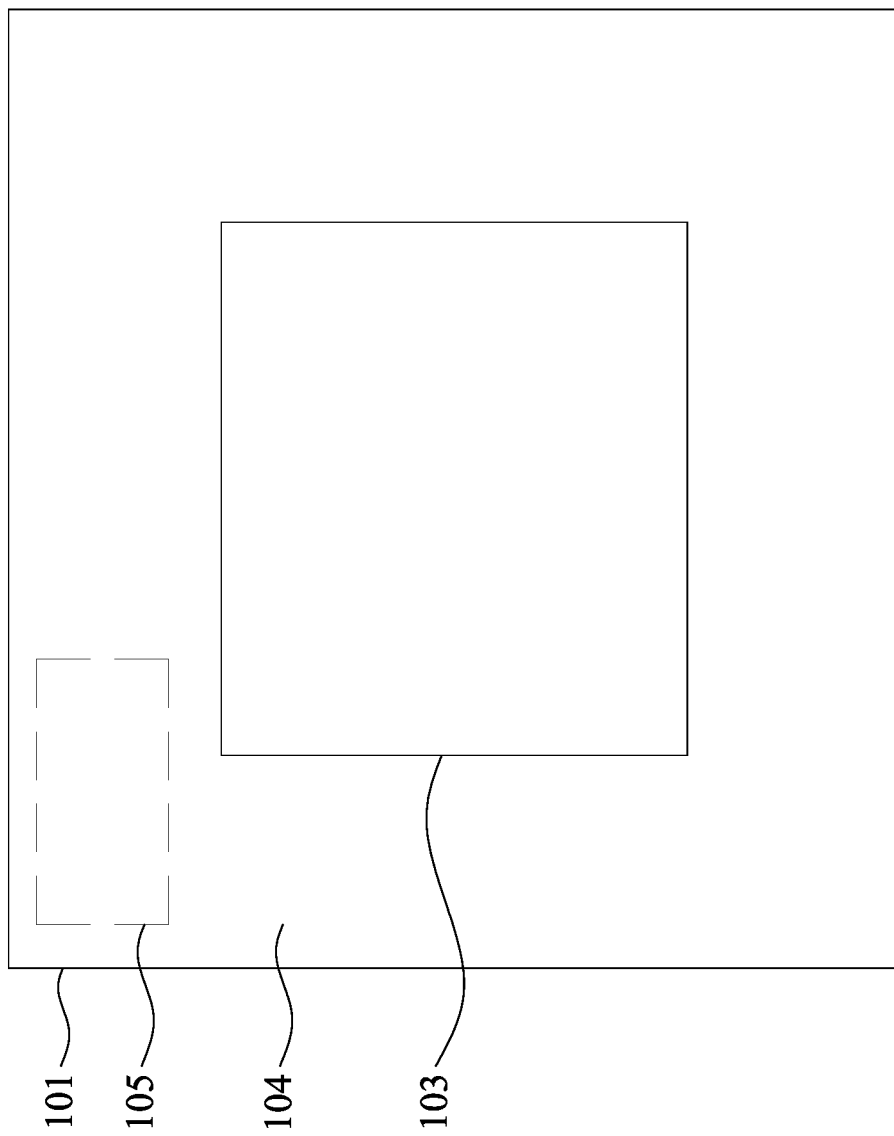
FIG. 2 is an enlarged view of a device region of the wafer in FIG. 1 in accordance with some embodiments of the present disclosure.

Referring to FIGS. 1 and 2, FIG. 1 is a top view of a wafer 100, and FIG. 2 is an enlarged view of a device region 101 of the wafer 100 according to various aspects of the present disclosure.

As shown in FIG. 1 and FIG. 2, the wafer 100 includes a plurality of device regions 101 and a scribe line region 102 surrounding each of the device regions 101. The device regions 101 may be separated by the scribe line region 102. In some embodiments, the plurality of device regions 101 define a plurality of dies or chips. In some embodiments, the scribe line region 102 defines a plurality of scribe lines between the plurality of dies. For ease of illustration, the device regions 101 can also be referred to as dies 101, and the scribe line region 102 can also be referred to as scribe lines 102. The wafer 100 may be sawed along the scribe lines 102 into the plurality of dies 101. Each of the dies 101 may include semiconductor devices, which can include active components and/or passive components. The active components may include a memory die (e.g., a dynamic random-access memory (DRAM) die, a static random-access memory (SRAM) die, etc.), a power management die (e.g., a power management integrated circuit (PMIC) die), a logic die (e.g., a system-on-a-chip (SoC), a central processing unit (CPU), a graphics processing unit (GPU), an application processor (AP), a microcontroller, etc.), a radio frequency (RF) die, a sensor die, a micro-electro-mechanical-system (MEMS) die, a signal processing die (e.g., a digital signal processing (DSP) die), a front-end die (e.g., an analog front-end (AFE) die) or other active components. Each of the active components may include multiple transistors. The transistors can include planar transistors, multi-gate transistors, gate-all-around field-effect transistors (GAAFET), fin field-effect transistors (FinFET), vertical transistors, nanosheet transistors, nanowire transistors, or a combination thereof. The passive components may include a capacitor, a resistor, an inductor, a fuse or other passive components. The conductive elements may include metal lines, metal islands, conductive vias, contacts or other conductive elements.

Referring to FIG. 2, FIG. 2 is an enlarged top view of a die 101 in FIG. 1. The die 101 may include a core region 103 and a peripheral region 104 surrounding the core region 103. In some embodiments, most of the active components or logic devices are disposed in the core region 103, and the most of the passive components are disposed in the peripheral region 104. In some embodiments, one or more fuse structures are disposed in a region 105 of the peripheral region 104. It should be noted that a position of the region 105 in the peripheral region 104 is for a purpose of illustration. The region 105 can be anywhere in the peripheral region 104, and is not limited herein.

Figure 3:
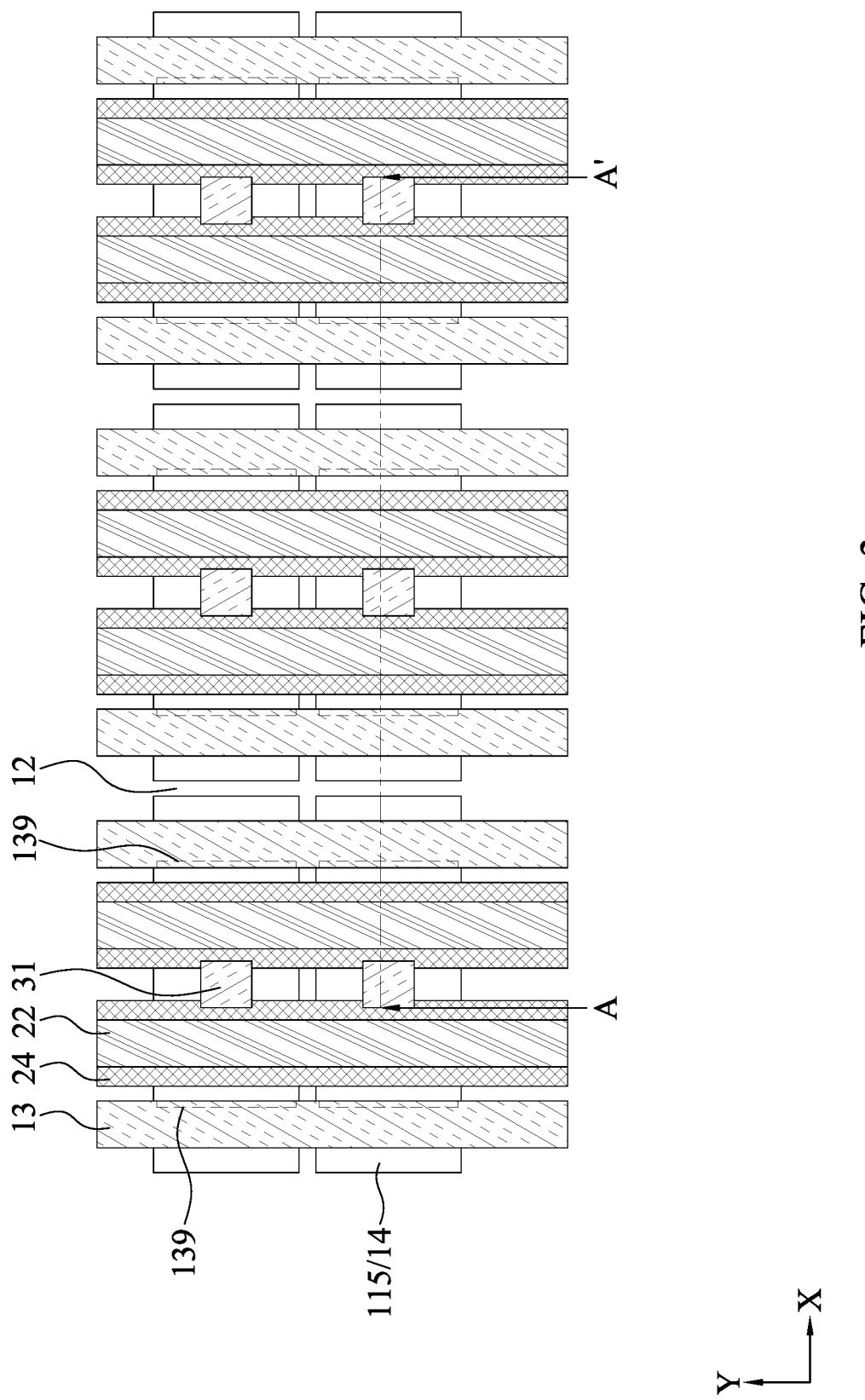
FIG. 3 is an enlarged top view of a semiconductor structure in FIG. 2 in accordance with some embodiments of the present disclosure.

Referring to FIG. 3, FIG. 3 is an enlarged top view perspective of the region 105 in FIG. 2. As FIG. 3 can represent any region of a peripheral region 104 of a chip 101, FIG. 3 can be considered as a top view of a semiconductor structure 200 in accordance with some embodiments of the present disclosure.

The semiconductor structure 200 may include an active area 115 in a substrate, an isolation 12 surrounding the active area 115, a gate structure 22 of a transistor, a trench fuse 13, and a contact 31. In some embodiments, two gate structures 22 (i.e., two transistors), two trench fuses 13 and one contact 31 are disposed in one active region 115. However, a number of the gate structures 22, the trench fuses 13 or the contacts 31 can be adjusted according to different embodiments, and is not limited herein.

In some embodiments, the gate structure 22 is disposed above the substrate, and the trench fuse 13 is disposed in the substrate (a detailed description is provided below). In some embodiments, the gate structure 22 and the trench fuse 13 are substantially parallel. In some embodiments, the gate structure 22 and the trench fuse 13 extend along a first direction (e.g., a Y direction). In some embodiments, the active area 115 extends along a second direction (e.g., an X direction). In some embodiments, the active area 115 is substantially perpendicular to the gate structure 22 or the trench fuse 13. In some embodiments, the contact 31 is disposed in a central region of the active area 115. In some embodiments, the contact 31 is between the two trench fuses 13. In some embodiments, the contact 31 is between the two gate structures 22. In some embodiments, a blown spot 139 of the fuse structure 13 is indicated with dashed lines.

A method of manufacturing a semiconductor structure having a top view perspective similar to that shown in FIG. 3 is also provided in the disclosure. In order to further illustrate concepts of the present disclosure, various embodiments are provided below. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to have different combinations of embodiments as long as the parameters or conditions used are not in conflict.

Figure 4:
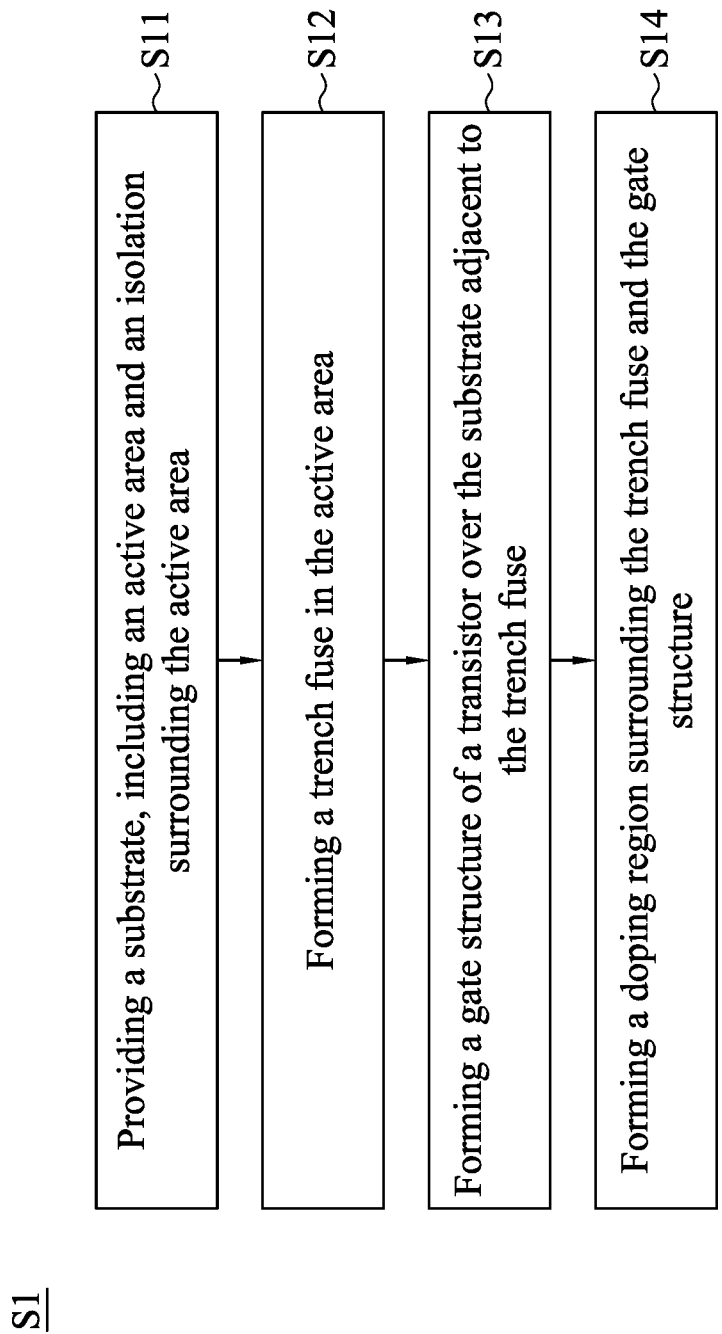
FIG. 4 is a flow diagram illustrating a method of manufacturing a semiconductor structure in accordance with some embodiments of the present disclosure.

FIG. 4 is a flow diagram illustrating a method S1 for manufacturing a semiconductor device in accordance with some embodiments of the present disclosure. The method S1 includes a number of operations (S11, S12, S13 and S14) and the description and illustration are not deemed as a limitation to the sequence of the operations. In the operation S11, a substrate is provided, wherein the substrate includes an active area and an isolation surrounding the active area. In the operation S12, a trench fuse is formed in the active area. In the operation S13, a gate structure of a transistor is formed over the substrate adjacent to the trench fuse. In the operation S14, a doping region is formed surrounding the trench fuse and the gate structure. It should be noted that the operations of the method S1 may be rearranged or otherwise modified within the scope of the various aspects. Additional processes may be provided before, during, and after the method S1, and some other processes may be only briefly described herein. Thus, other implementations are possible within the scope of the various aspects described herein.

FIGS. 5 to 24 are schematic diagrams illustrating various fabrication stages constructed according to the method S1 for manufacturing a semiconductor structure 300 in accordance with some embodiments of the present disclosure. The stages shown in FIGS. 5 to 24 are also illustrated schematically in the process flow in FIG. 4. In the subsequent discussion, the fabrication stages shown in FIGS. 5 to 24 are discussed in reference to the process steps in FIG. 4.

Figure 5:
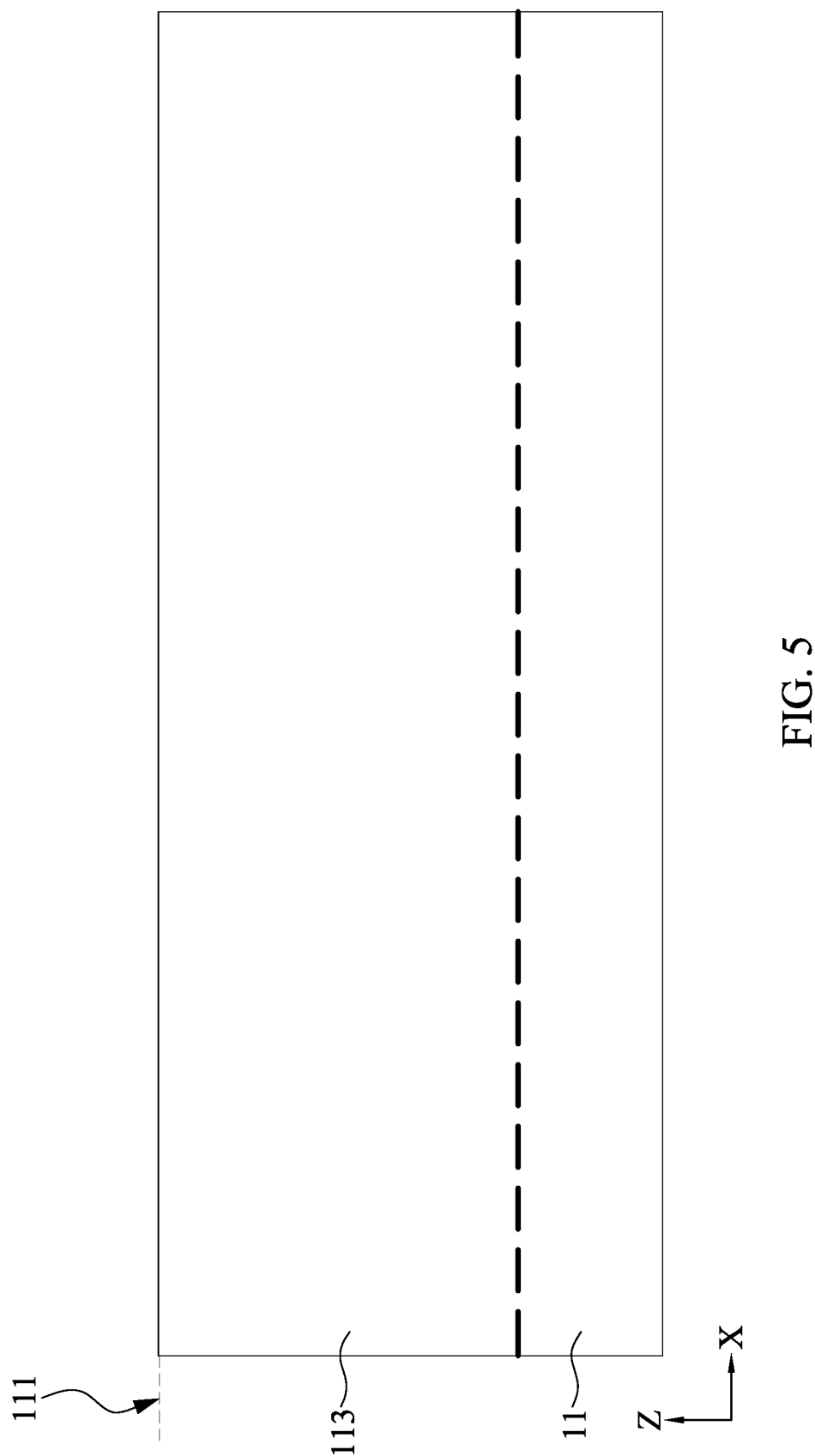
FIGS. 5 to 24 are schematic diagrams illustrating various fabrication stages constructed according to the method of manufacturing a semiconductor structure in accordance with some embodiments of the present disclosure.

Referring to FIG. 5, FIG. 5 is a schematic cross-sectional diagram along a line A-A' in FIG. 3 in accordance with some embodiments of the present disclosure. In the operation S11, a substrate 11 is provided, received, or formed. The substrate 11 may include a top surface 111. In some embodiments, the top surface 111 is a planar surface. In some embodiments, an implanting operation is performed on the substrate 11 to form a well region 113 in the substrate 11.

In some embodiments, the substrate 11 may have a multilayer structure, or the substrate 11 may include a multilayer compound semiconductor structure. In some embodiments, the substrate 11 may be a semiconductor substrate. The active components, passive components, and/or conductive elements as mentioned above can be formed in and/or over a semiconductor substrate. The semiconductor substrate may be a bulk semiconductor, a semiconductor-on-insulator (SOI) substrate, or the like. The semiconductor substrate can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Si:Ge feature in which Si and Ge compositions change from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy.

Figure 6:
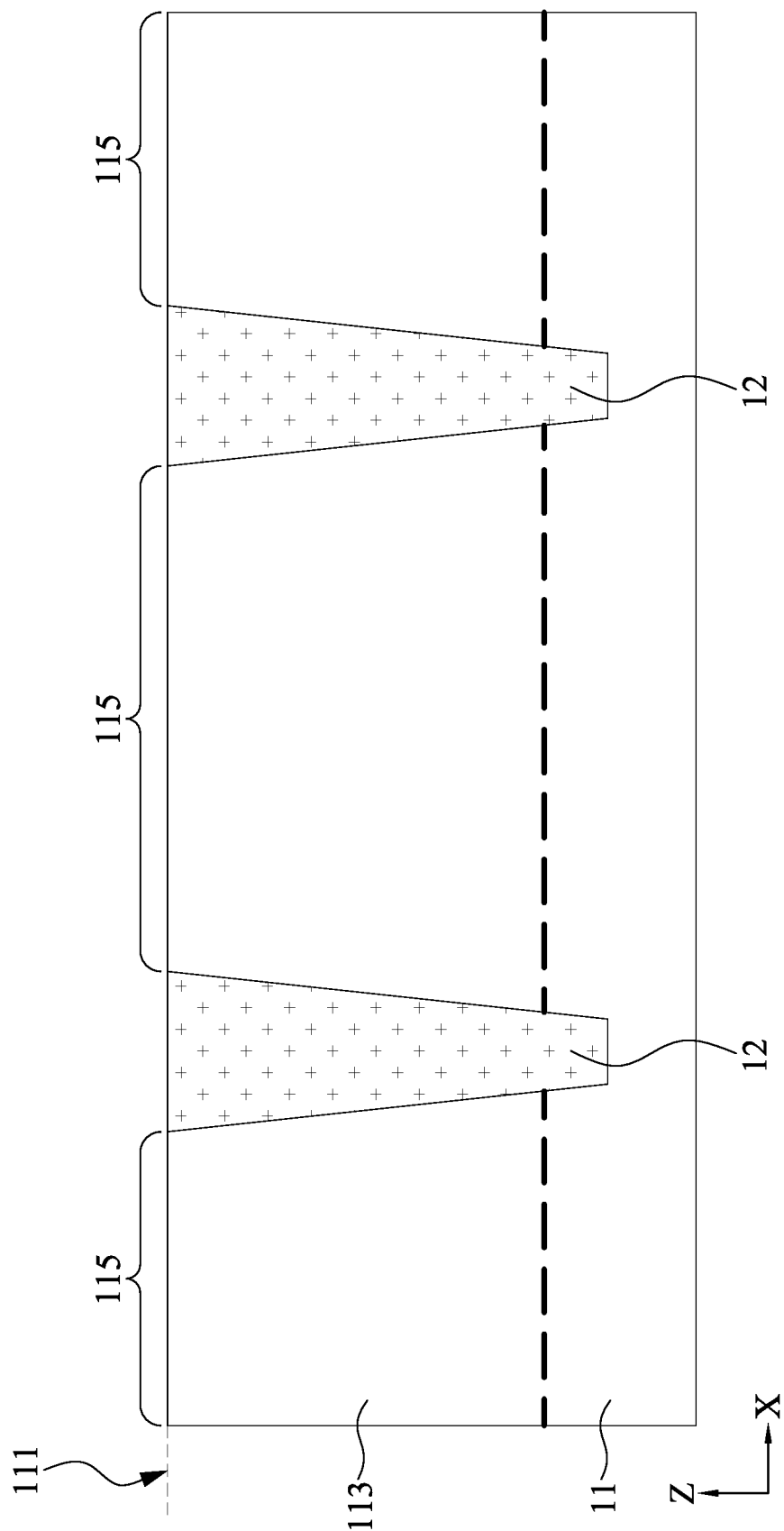

Referring to FIG. 6, FIG. 6 is a schematic cross-sectional diagram along the line A-A' in FIG. 3 in accordance with some embodiments of the present disclosure. Still in the operation S11, an isolation 12 is formed in the substrate 11, and one or more active areas 115 are defined by the isolation 12 in the well region 113. The two isolations 12 shown in FIG. 6 may be a monolithic structure and can be connected in the top view perspective as shown in FIG. 3. In some embodiments, the well region 113 is divided into the active areas 115. In some embodiments, each of the active areas 115 is surrounded by the isolation 12. In some embodiments, each of the active areas 115 is encircled by the isolation 12.

A depth of the well region 113 from the top surface 111 of the substrate can be adjusted according to different applications, and is not limited herein. For ease of illustration, the well region 113 may be omitted from the figures in the following disclosure.

Formation of the isolation 12 can include several operations. In some embodiments, portions of the substrate 11 are removed by an etching operation. In some embodiments, the etching operation includes a selective wet etching, a directional dry etching, an ion beam etching, a reactive ion etching, or a combination thereof. In some embodiments, a deposition of dielectric material of the isolation 12 is performed to deposit the dielectric material in the removed portions of the substrate 11 to form the isolation 12. In some embodiments, the deposition includes chemical vapor deposition (CVD), atomic layer deposition (AI JD), physical vapor deposition (PVD), or other suitable methods. In some embodiments, a planarization, such as a chemical mechanical polishing (CMP), is performed after the deposition of the dielectric material of the isolation 12. In some embodiments, a top surface of the isolation 12 is substantially coplanar with the top surface 111 of the substrate. In some embodiments, a photoresist layer is formed prior to the etching operation. In some embodiments, prior to the deposition of the isolation 12, pre-cleaning, photoresist application (formation of the photoresist layer), exposure, developing and the etching operation are sequentially performed to remove the portions of the substrate. In some embodiments, the photoresist layer is removed after the etching operation.

Figure 7:
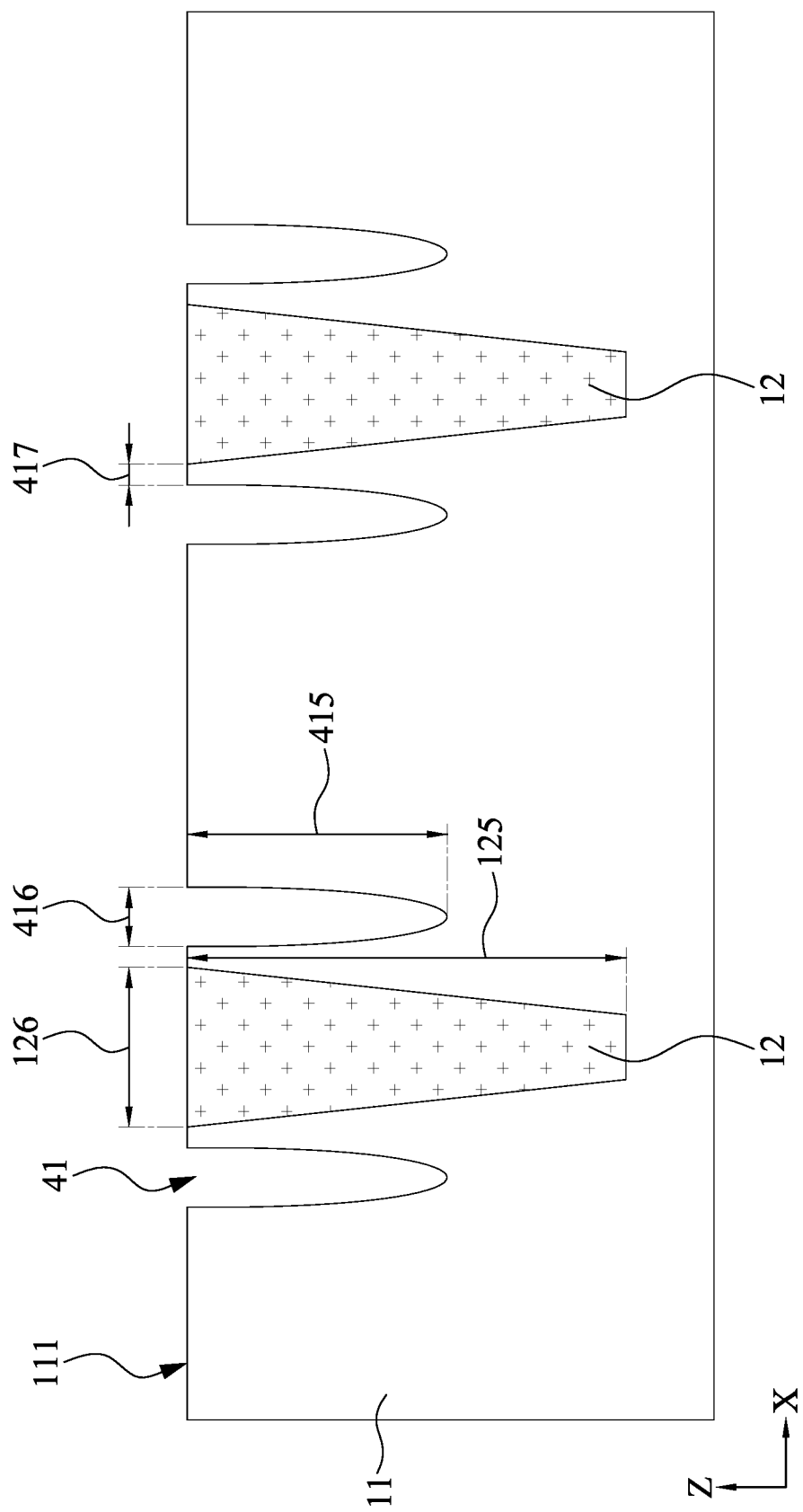

Referring to FIG. 7, FIG. 7 is a schematic cross-sectional diagram along the line A-A' in FIG. 3 in accordance with some embodiments of the present disclosure. The operation S12 begins with FIG. 7, in which portions of the substrate 11 adjacent to the isolation 12 are removed. In some embodiments, the portions of the substrate 11 are removed by one or more etching methods as illustrated above. A plurality of trenches 41 are formed by the etching operation. A depth 415 of the trenches 41 may be less than a depth 125 of the isolation 12. In some embodiments, the depth 415 of the trenches 41 is in a range of 100 to 200 nanometers (nm). A width 416 of the trenches 41 may be less than a width 126 of the isolation 12. In some embodiments, the width 416 of the trenches 41 is in a range of 30 to 60 nm. In some embodiments, a distance 417 between the isolation 12 and an adjacent trench 41 is in a range of 0 to 60 nm.

Figure 8:
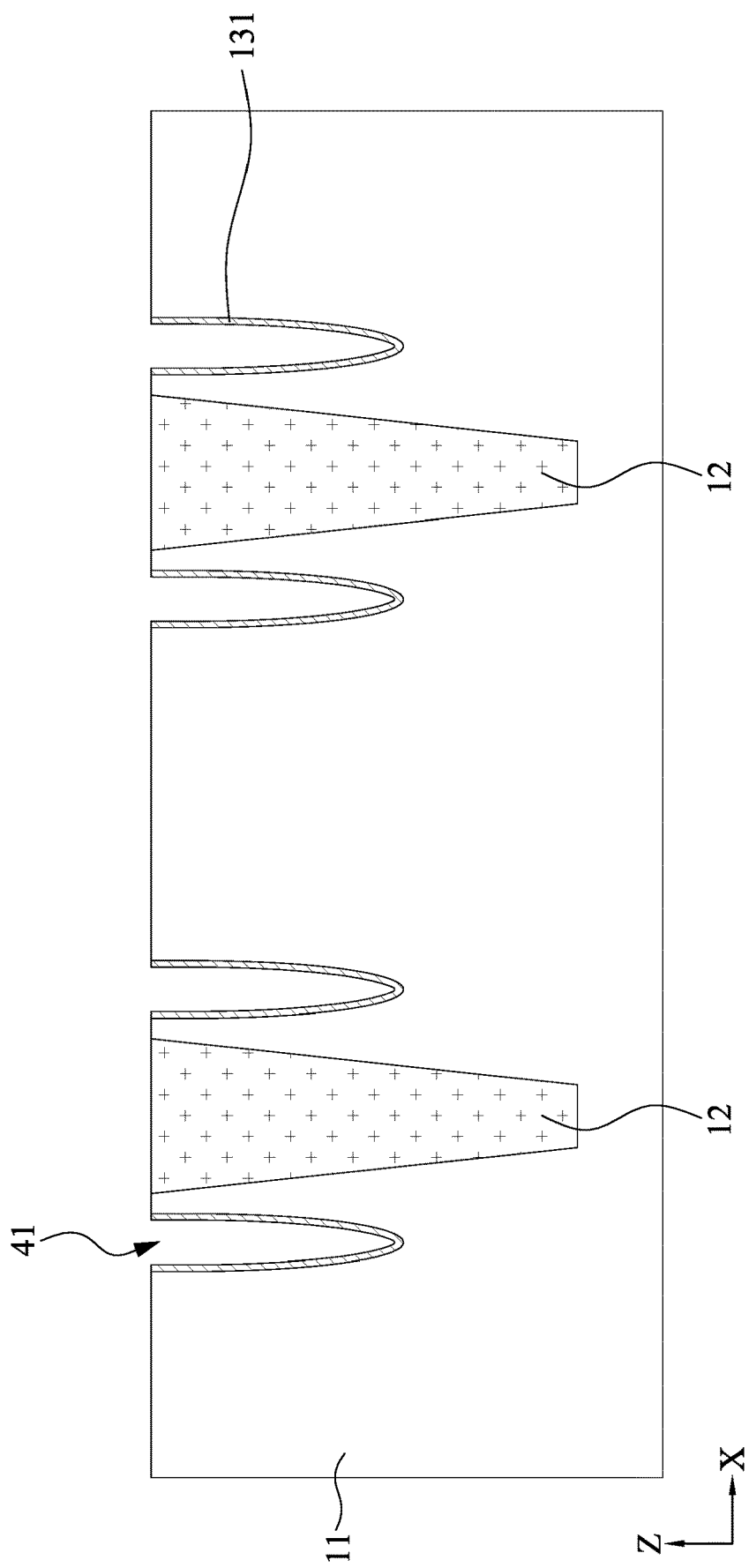

Referring to FIG. 8, FIG. 8 is a schematic cross-sectional diagram along the line A-A' in FIG. 3 in accordance with some embodiments of the present disclosure. A fuse layer 131 is formed lining the trenches 41. In some embodiments, the fuse layer 131 include polysilicon. In some embodiments, the fuse layer 131 includes metallic material. In some embodiments, the fuse layer 131 includes oxide. In some embodiments, the fuse layer 131 is formed by in-situ-steam-generation-process (ISSG) oxidation. In some embodiments, the fuse layer 131 lines an entirety of the trenches 41. In some embodiments, the fuse layer 131 is disposed only in the trenches 41.

Figure 9:
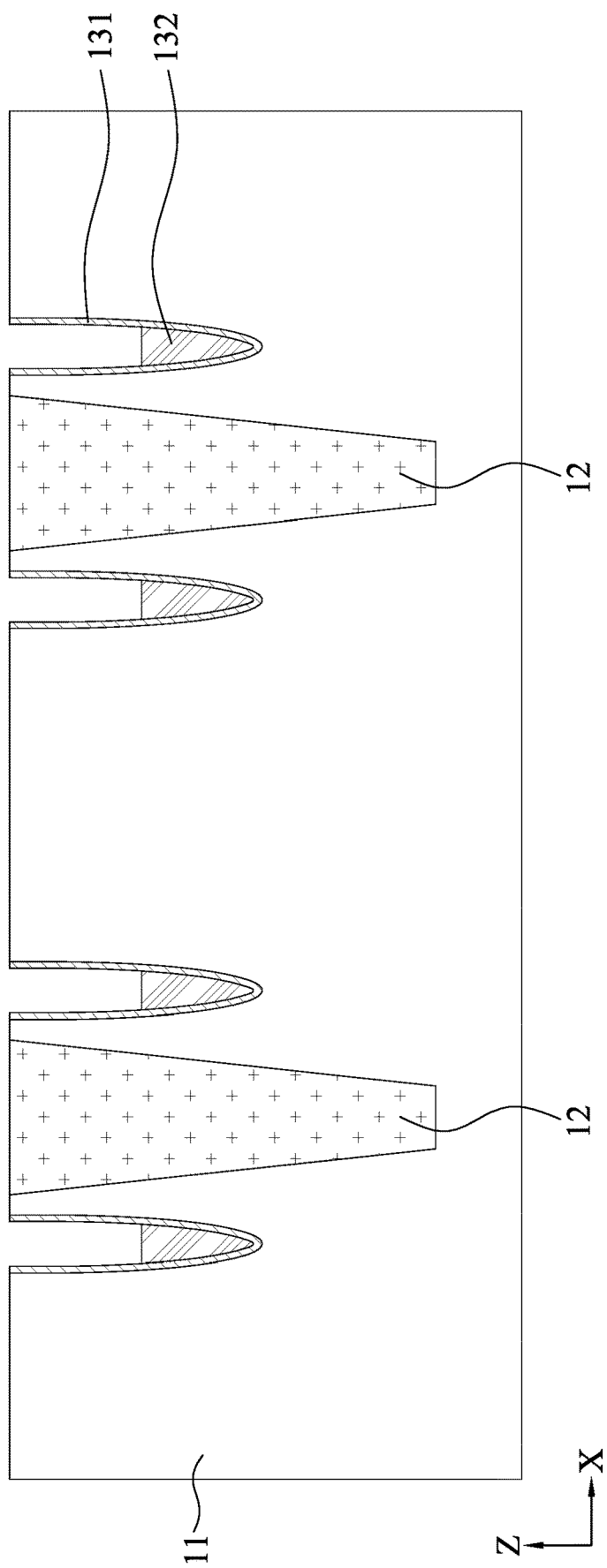

Referring to FIG. 9, FIG. 9 is a schematic cross-sectional diagram along the line A-A' in FIG. 3 in accordance with some embodiments of the present disclosure. A first layer 132 is formed in the trenches 41. The first layer 132 may be a metal layer or include metallic component. In some embodiments, the first layer 132 includes aluminum (Al), copper (Cu), tungsten (W), titanium (Ti), tantalum (Ta), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr), titanium nitride (TiN), tungsten nitride (WN), tantalum nitride (TaN), ruthenium (Ru), titanium silicon nitride (TiSiN), other suitable materials, or a combination thereof. In some embodiments, the first layer 132 is a tungsten layer, and the first layer 132 is formed concurrently with a tungsten layer of a word line (WL) structure in the core region 103.

The first layer 132 may be formed by a deposition over the substrate 11 and fills the trenches 41. In some embodiments, the first layer 132 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, an etch-back operation is performed on the first layer 132 to ensure that the first layer 132 is inside the trenches 41. In some embodiments, a height of the first layer 132 is less than the depth 415 of the trenches 41 shown in FIG. 7. In some embodiments, the height of the first layer 132 is substantially equal to a thickness of the tungsten layer of the WL structure.

Figure 10:
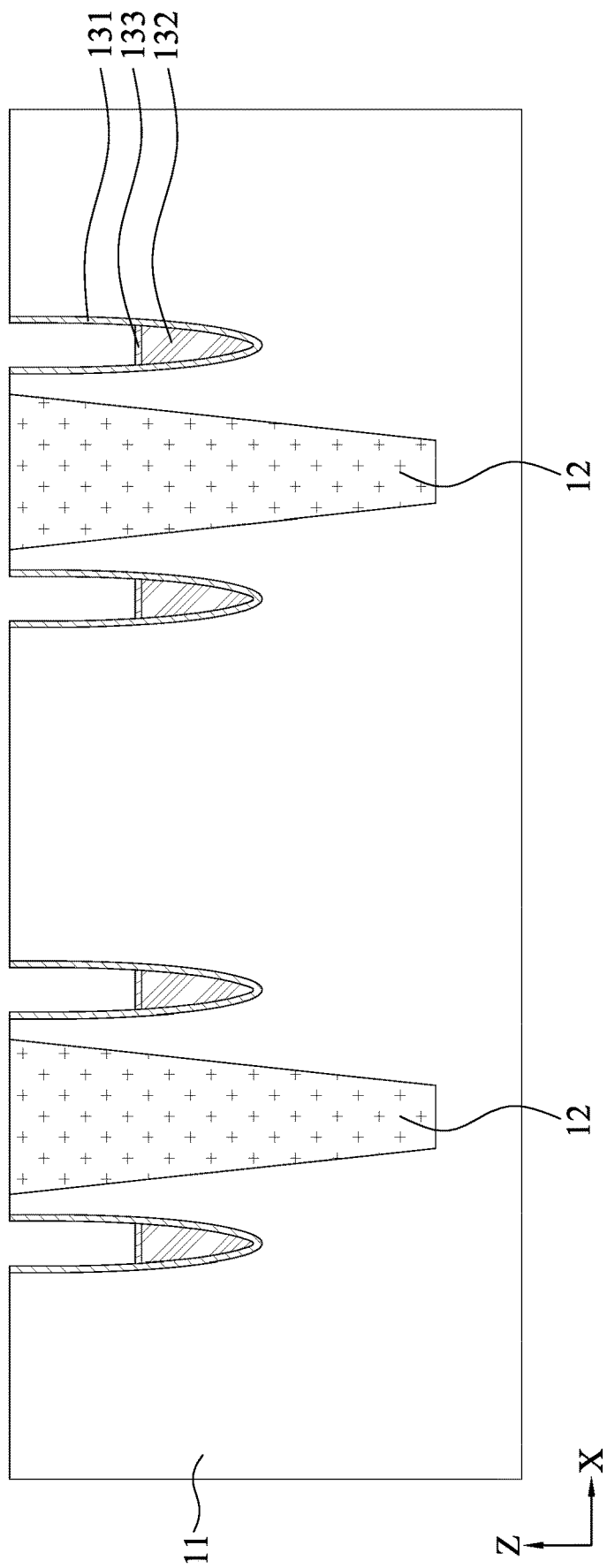

Referring to FIG. 10, FIG. 10 is a schematic cross-sectional diagram along the line A-A' in FIG. 3 in accordance with some embodiments of the present disclosure. A second layer 133 is formed in the trenches 41 over the first layer 132. The second layer 133 may be a nitride layer or a metallic nitride layer. In some embodiments, the second layer 133 includes titanium nitride (TiN), tungsten nitride (WN), tantalum nitride (TaN), titanium silicon nitride (TiSiN), other suitable materials, or a combination thereof. In some embodiments, the second layer 133 is a TiN layer, and the second layer 133 is formed concurrently with a TiN layer of the WL structure in the core region 103.

The second layer 133 may be formed by a deposition over the substrate 11 and fills the trenches 41. In some embodiments, the second layer 133 is formed by a chemical vapor deposition (CVD), a physical vapor deposition (PVD), an atomic layer deposition (ALD), a low-pressure chemical vapor deposition (LPCVD), a plasma-enhanced CVD (PECVD), or a combination thereof. In some embodiments, an etch-back operation is performed on the second layer 133 to ensure that the second layer 133 is inside the trenches 41. In some embodiments, a thickness of the second layer 133 is less than the depth 415 of the trenches 41 shown in FIG. 7. In some embodiments, the thickness of the second layer 133 is substantially equal to a thickness of the TiN layer of the WL structure.

Figure 11:
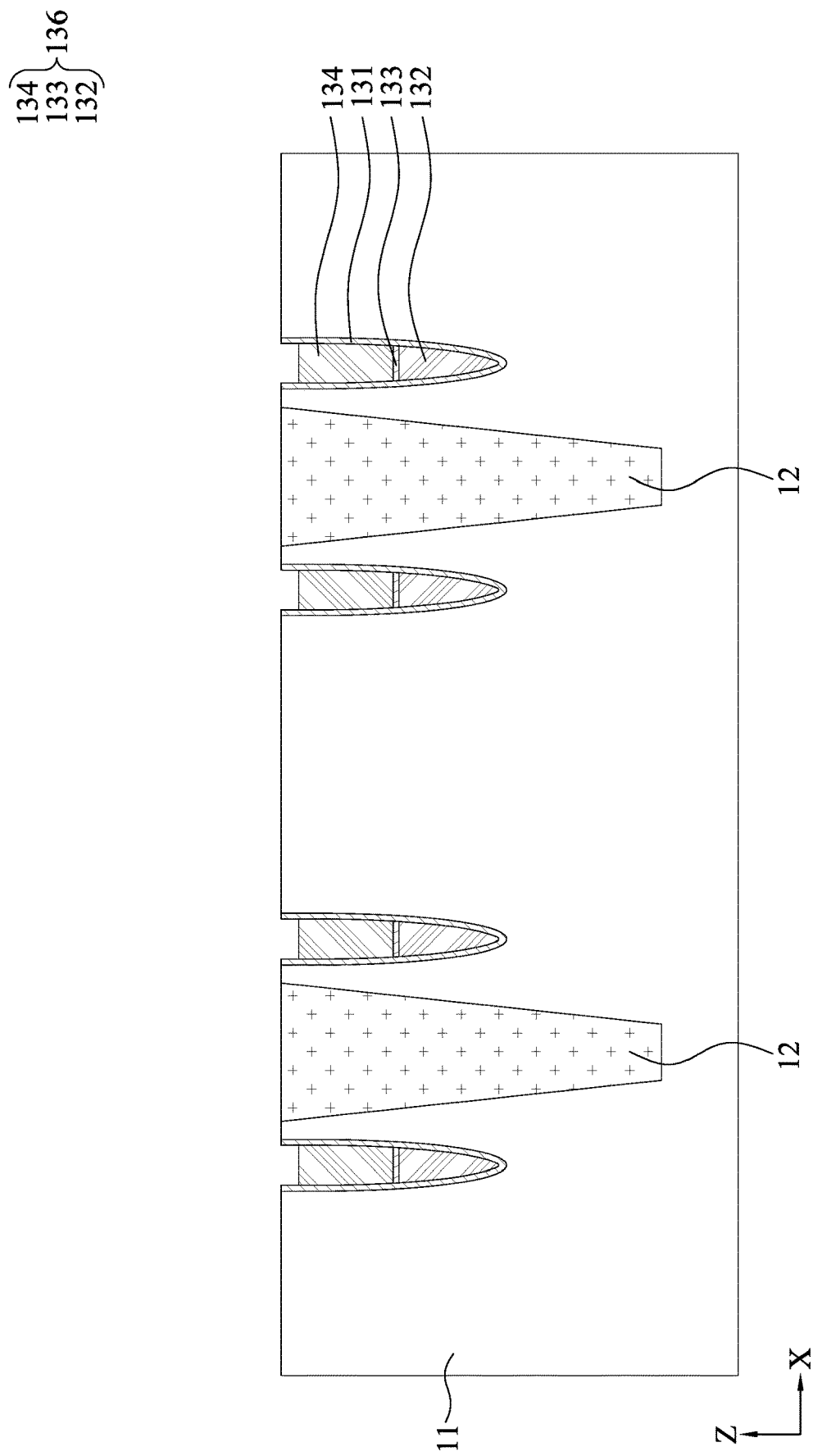

Referring to FIG. 11, FIG. 11 is a schematic cross-sectional diagram along the line A-A' in FIG. 3 in accordance with some embodiments of the present disclosure. A third layer 134 is formed in the trenches 41. In some embodiments, the third layer 134 is selected from one or more of the possible materials of the first layer 132 as listed above. In some embodiments, a material of the third layer 134 is different from that of the first layer 132. In some embodiments, the third layer 134 include semiconductive material, e.g., silicon. In some embodiments, the third layer 134 is a polysilicon layer, and the third layer 134 is formed concurrently with a polysilicon layer of the word line (WL) structure in the core region 103.

The third layer 134 may be formed by a deposition over the substrate 11 and fills the trenches 41. In some embodiments, the third layer 134 is formed by a CVD, a PVD, an ALD, an LPCVD, a PECVD, or a combination thereof. In some embodiments, an etch-back operation is performed on the third layer 134 to ensure that the third layer 134 is inside the trenches 41. In some embodiments, a height of the third layer 134 is less than the depth 415 of the trenches 41 shown in FIG. 7. In some embodiments, the height of the third layer 134 is substantially equal to a thickness of the polysilicon layer of the WL structure.

In some embodiments, the first layer 132, the second layer 133 and the third layer 134 together define a conductive stack 136 in the trench 41, wherein the conductive stack 136 is surrounded by the fuse layer 131. In some embodiments, the fuse layer 131 is sandwiched between the conductive stack 13 and the substrate 11. It should be noted that compositions or layers of the conductive stack 136 described above are merely exemplary embodiments. In alternative embodiments, the conductive stack 136 can include one, two or another number of layers. In some embodiments, wherein the conductive stack 136 includes a composition different from that of the WL structure, the formation of the conductive stack is performed prior to or after the formation of the WL structure in the core region 103.

Figure 12:
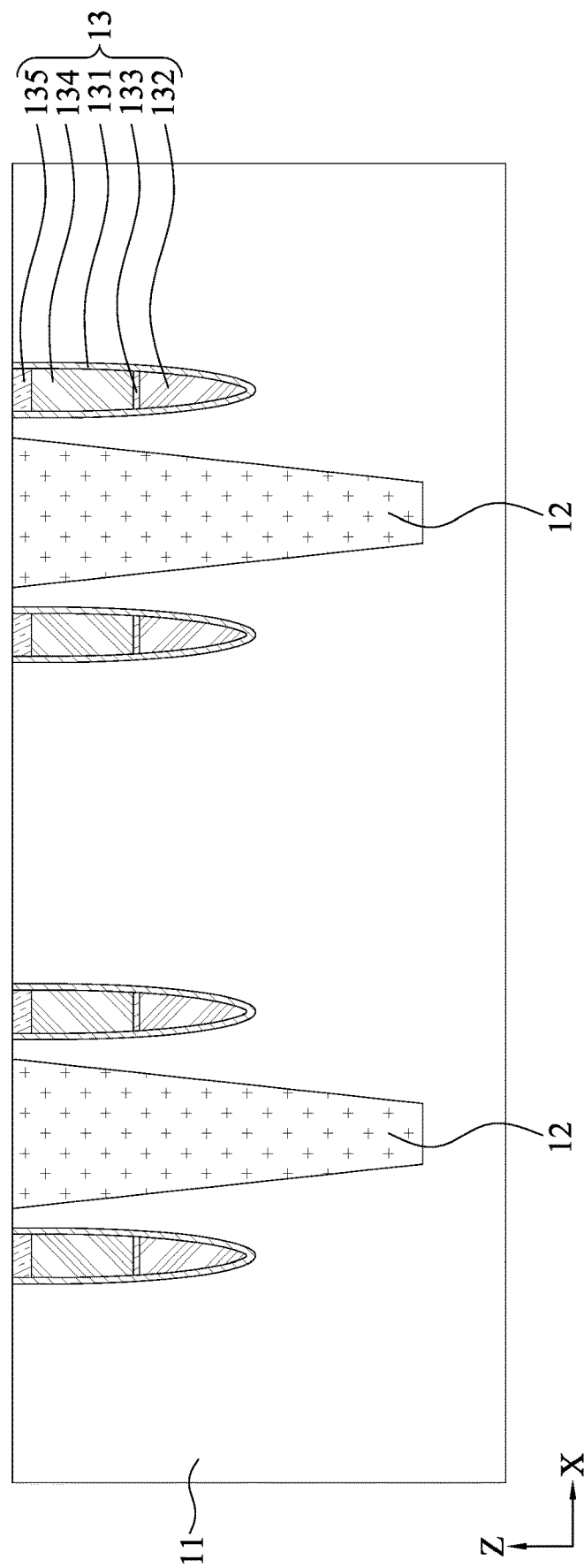

Referring to FIG. 12, FIG. 12 is a schematic cross-sectional diagram along the line A-A' in FIG. 3 in accordance with some embodiments of the present disclosure. A fourth layer 135 is formed in the trenches 41. The fourth layer 135 can function as a capping layer or a protection layer. In some embodiments, the fourth layer 135 includes a dielectric material. In some embodiments, the fourth layer 135 includes nitride. In some embodiments, the fourth layer 135 is a silicon nitride layer, and the fourth layer 135 is formed concurrently with a silicon nitride layer at a top of the WL structure in the core region 103. In some embodiments, the fourth layer 135 is surrounded by the fuse layer 131 in the trenches 41.

The fourth layer 135 may be formed by a deposition over the substrate 11 and fills the trenches 41. In some embodiments, the fourth layer 135 is formed by a CVD, a PVD, an ALD, an LPCVD, a PECVD, or a combination thereof. In some embodiments, an etch-back operation or a planarization is performed on the fourth layer 135 to remove portions of the fourth layer 135 outside the trenches 41. In some embodiments, a top surface of the fourth layer 135 is substantially coplanar with the top surface 111 of the substrate 11. In some embodiments, a total thickness of the first layer 132, the second layer 133, the third layer 134 and the fourth layer 135 is substantially equal to the depth 415 of the trenches 41 shown in FIG. 7. In some embodiments, a thickness of the fourth layer 135 is substantially equal to a thickness of the silicon nitride layer of the WL structure.

Therefore, as depicted in FIGS. 7 to 12, a trench fuse 13 including the fuse layer 131, the first layer 132, the second layer 133, the third layer 134 and the fourth layer 135 is formed in the substrate 11 and adjacent to the isolation 12. In some embodiments, the trench fuse 13 is referred to as a conductive trench structure 13. Since a depth and a width of the trench fuse 13 are defined by the trench 41, the depth and the width of the trench fuse 13 are substantially equal to the depth 415 and the width 416 of the trench 41 respectively.

Figure 13:
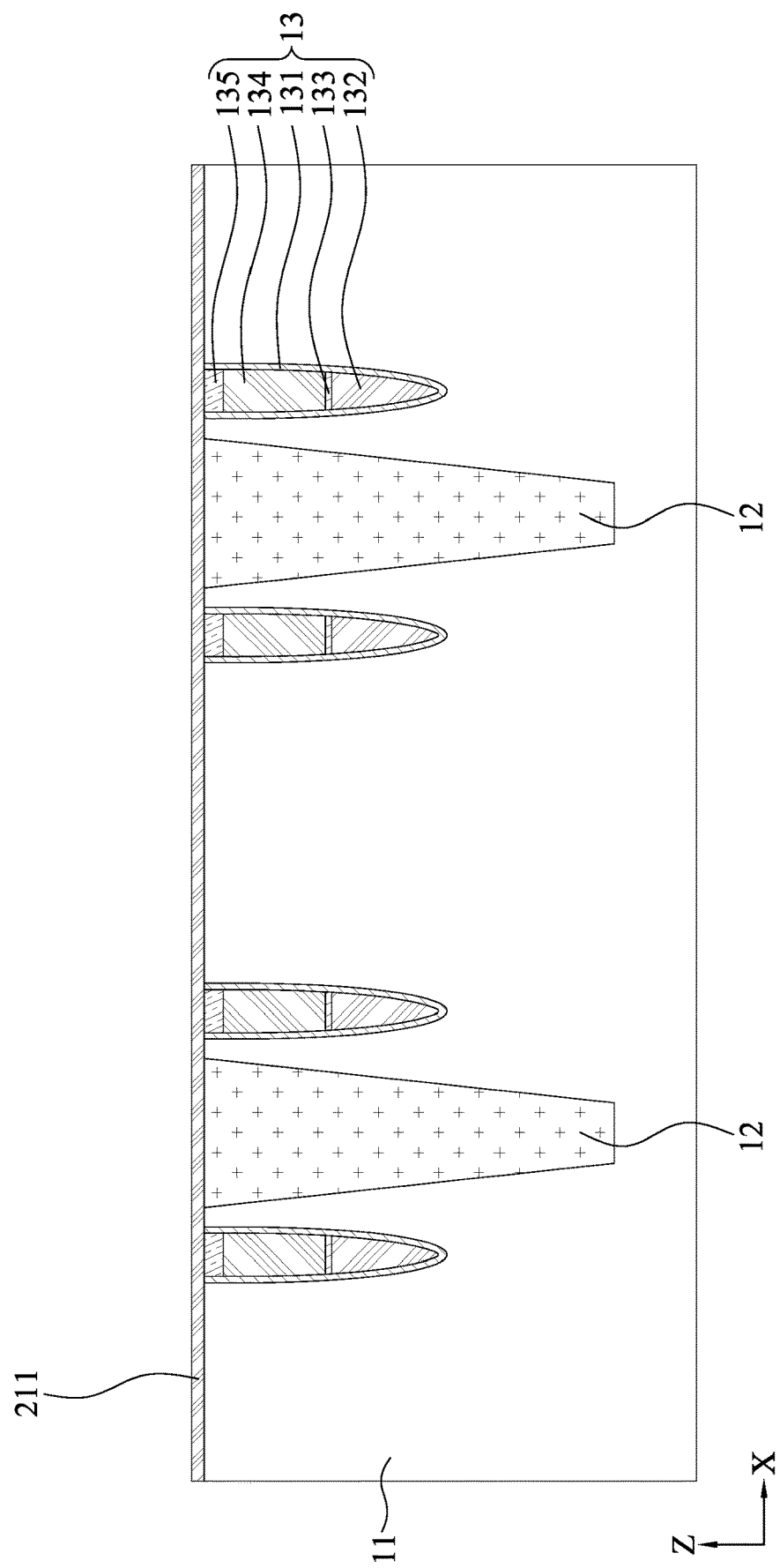

Referring to FIG. 13, FIG. 13 is a schematic cross-sectional diagram along the line A-A' in FIG. 3 in accordance with some embodiments of the present disclosure. The operation S13 begins with FIG. 13, in which a dielectric layer 211 is formed over the substrate 11. In some embodiments, the dielectric layer 211 is formed by a blanket deposition. In some embodiments, the dielectric layer 211 is formed by a CVD, a PVD, an ALD, an LPCVD, a PECVD, or a combination thereof. In some embodiments, the dielectric layer 211 covers the substrate 11, the isolation 12 and the trench fuse 13.

In some embodiments, the dielectric layer 211 can include silicon oxide ($SiO_x$), silicon nitride ($Si_xN_y$), silicon oxynitride (SiON), or a combination thereof. In some embodiments, the dielectric layer 211 can include high-k dielectric material. The high-k dielectric material may have a dielectric constant (k value) greater than 4. The high-k material may include hafnium oxide ($HfO_2$), zirconium oxide ($ZrO_2$), lanthanum oxide ($La_2O_3$), yttrium oxide ($Y_2O_3$), aluminum oxide ($Al_2O_3$), titanium oxide ($TiO_2$) or another applicable material. Other suitable materials are within the contemplated scope of this disclosure.

Figure 14:
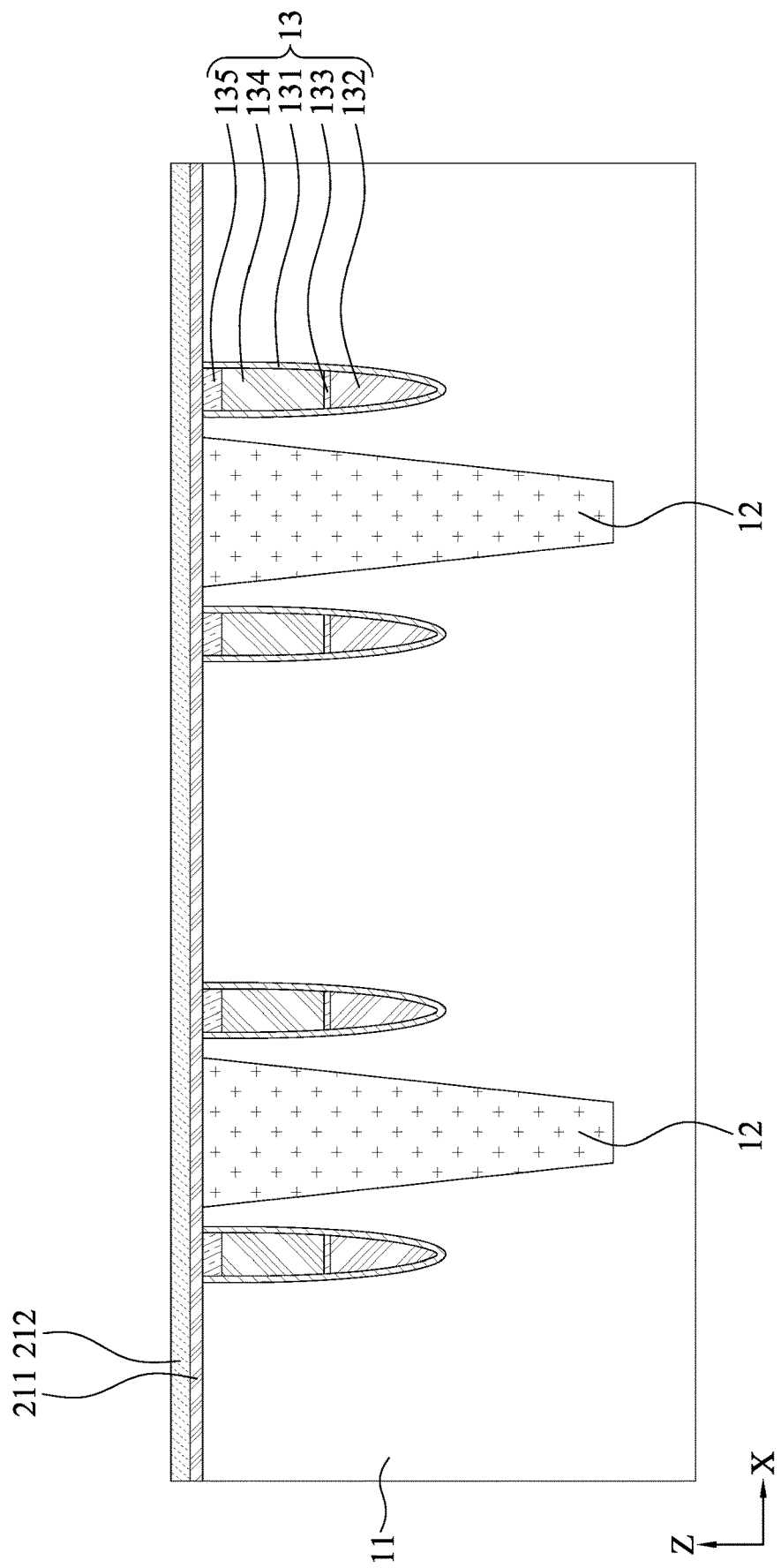

Referring to FIG. 14, FIG. 14 is a schematic cross-sectional diagram along the line A-A' in FIG. 3 in accordance with some embodiments of the present disclosure. A gate material layer 212 is formed over the dielectric layer 211. In some embodiments, the gate material layer 212 is formed by a blanket deposition. In some embodiments, the gate material layer 212 is formed by a CVD, a PVD, an ALD, an LPCVD, a PECVD, or a combination thereof. In some embodiments, the gate material layer 212 covers an entirety of the dielectric layer 211. In some embodiments, a thickness of the gate material layer 212 is substantially greater than the thickness of the dielectric layer 211.

In some embodiments, the gate material layer 212 can include a polysilicon layer. In some embodiments, the gate material layer 212 can be made of a conductive material, such as aluminum (Al), copper (Cu), tungsten (W), titanium (Ti), tantalum (Ta), or other applicable materials. In some embodiments, the gate material layer 212 can include a work function layer. The work function layer is made of a metal material, and the metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or a combination thereof. The P-work-function metal includes titanium nitride (TiN), tungsten nitride (WN), tantalum nitride (TaN), ruthenium (Ru) or a combination thereof. Other suitable materials are within the contemplated scope of the disclosure. The gate material layer 212 can be formed by to chemical vapor deposition (LPCVD) and plasma-enhanced CND (PECVD).

Figure 15:
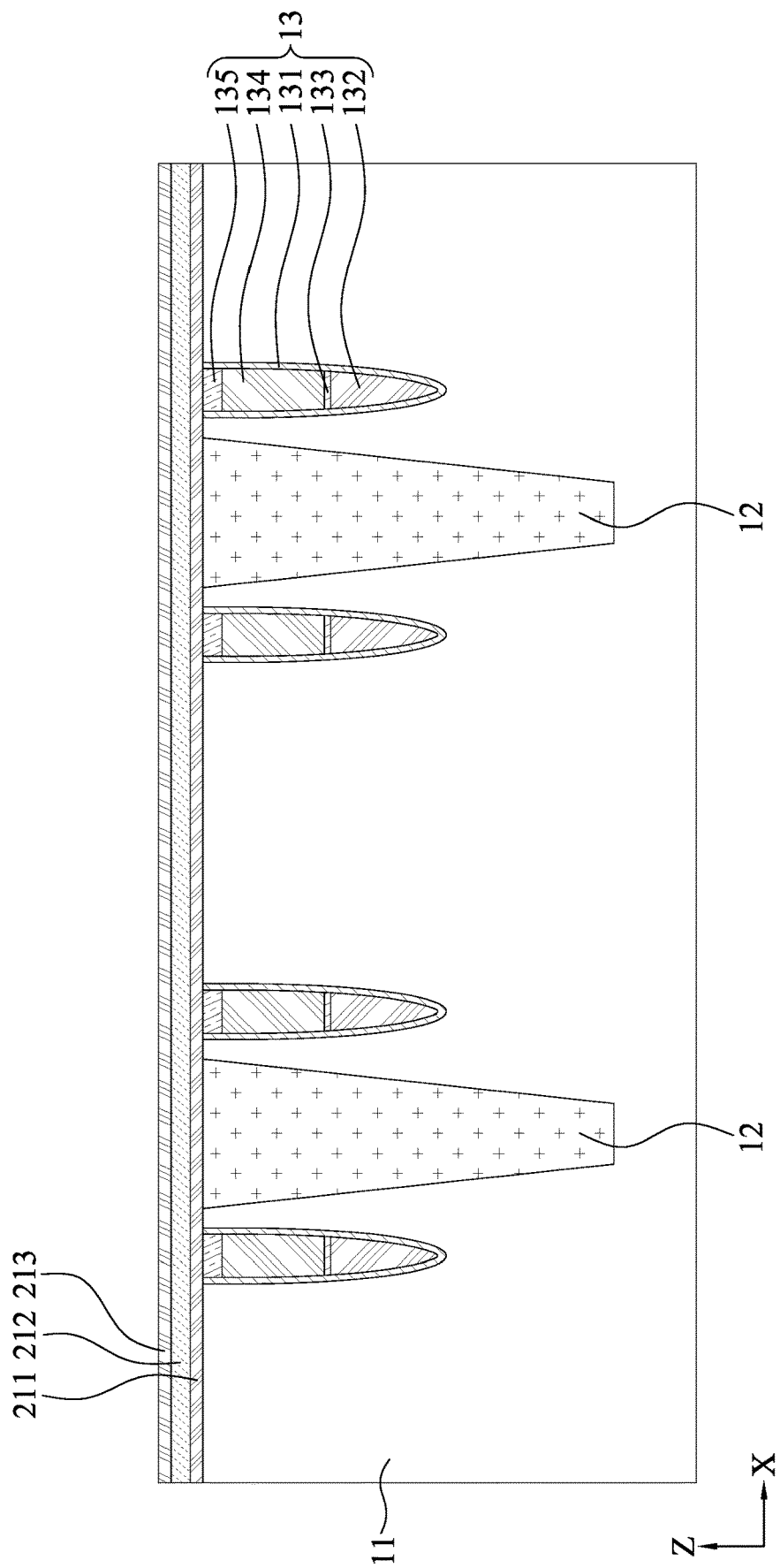

Referring to FIG. 15, FIG. 15 is a schematic cross-sectional diagram along the line A-A' in FIG. 3 in accordance with some embodiments of the present disclosure. A contact material layer 213 is formed over the gate material layer 212. In some embodiments, the contact material layer 213 is formed by a blanket deposition. In some embodiments, the contact material layer 213 is formed by a CVD, a PVD, an ALD, an LPCVD, a PECVD, or a combination thereof. In some embodiments, the contact material layer 213 covers an entirety of the gate material layer 212. In some embodiments, a thickness of the contact material layer 213 is substantially less than the thickness of the gate material layer 212.

The contact material layer 213 can include conductive material. In some embodiments, the contact material layer 213 includes metallic material. In some embodiments, the contact material layer 213 includes metals, such as W, Ta, Ti, Ni, Co, Hf, Ru, Zr, Zn, Fe, Sn, Al, Cu, Ag, Mo, Cr, alloy, other suitable materials, or a combination thereof. In some embodiments, the gate material layer 212 includes polysilicon, and the contact material layer 213 includes tungsten.

Figure 16:
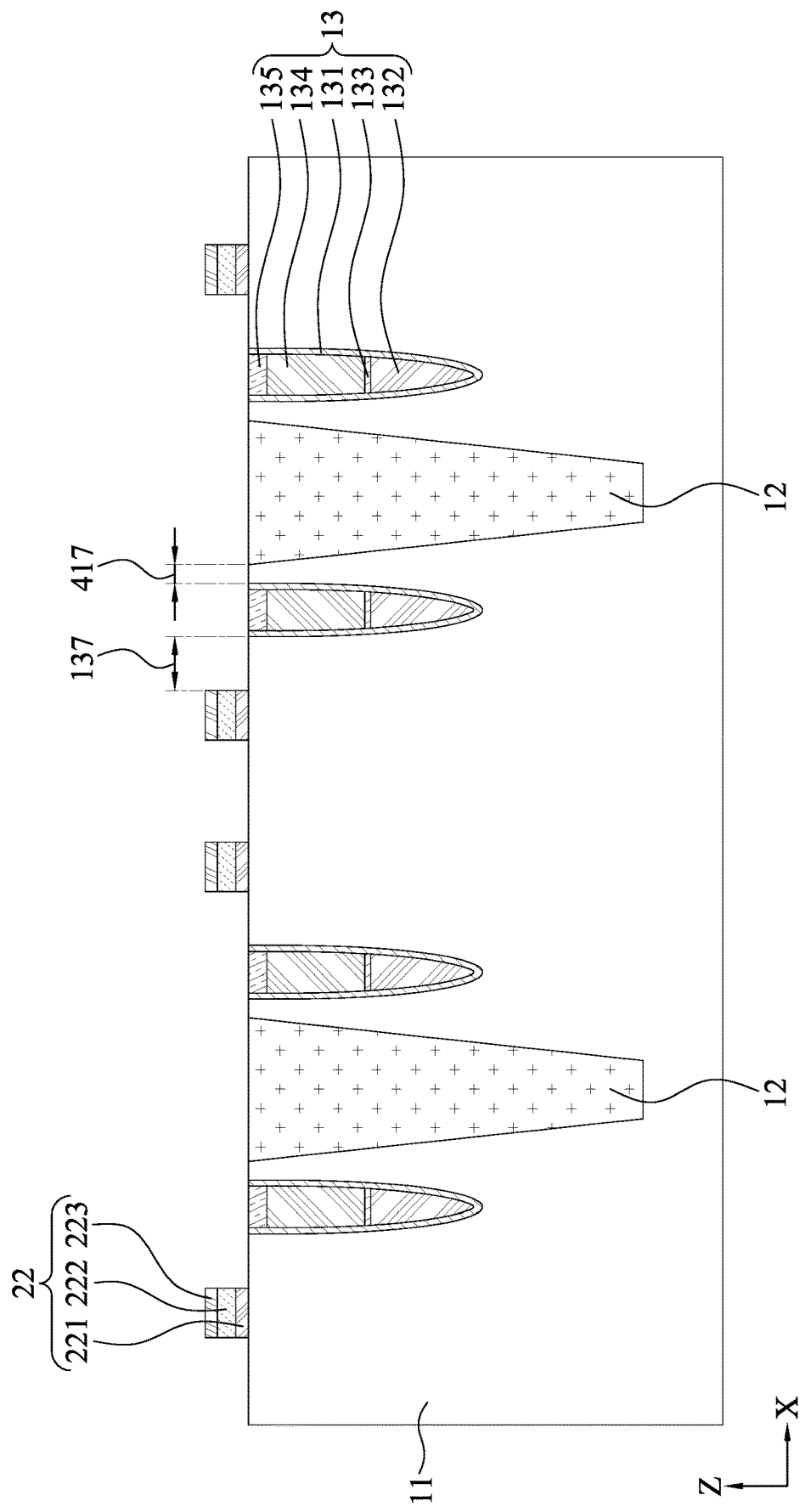

Referring to FIG. 16, FIG. 16 is a schematic cross-sectional diagram along the line A-A' in FIG. 3 in accordance with some embodiments of the present disclosure. A patterning operation is performed on the contact material layer 213, the gate material layer 212, and the dielectric layer 211. In some embodiments, the patterning operation includes one or more etching operations. The contact material layer 213, the gate material layer 212, and the dielectric layer 211 can be patterned concurrently by one etching operation or sequentially by different etching operations. In some embodiments, a photoresist layer is formed prior to the etching operation(s). In some embodiments, after the formation of the contact material layer 213, pre-cleaning, photoresist application (formation of the photoresist layer), exposure, developing and the etching operation are sequentially performed to remove portions of the contact material layer 213, the gate material layer 212, and the dielectric layer 211 using a same photoresist layer as a mask. In some embodiments, the photoresist layer is removed after the etching operation.

A plurality of gate structures 22 are defined after the patterning operation. In some embodiments, the dielectric layer 211 is patterned to form a plurality of gate dielectrics 221. In some embodiments, the gate material layer 212 is patterned to form a plurality of gate electrodes 222. In some embodiments, the contact material layer 213 is patterned to form a plurality of contact layers 223. A stack of a gate dielectric 221 a gate electrode 222, and a contact layer 213 becomes a gate structure 22 of a transistor to be formed in subsequent processing. In some embodiments, the distance 417 between the isolation 12 and the trench fuse 13 is substantially equal to or less than a distance 137 between the gate structure 22 and the trench fuse 13 for a better control of alignment.

The gate structures 22 may have a top view as shown in FIG. 3. In some embodiments, an active area 115 includes two gate structures 22. In some embodiments, a gate structure 22 extends over the substrate 11 across two active areas 115. However, a number of the gate structures 22 in an active area 115 or a number of the active areas 115 under one gate structure 22 can be adjusted according to different applications, and is not limited thereto. In some embodiments, the gate structures 22 in an active area 115 are disposed between two adjacent trench fuses 13 in the same active area 115. In other words, an active area 115 includes two trench fuses 13 disposed at two opposite sides of a gate structure 22 (or a plurality of gate structures 22). In some embodiments, each of the trench fuses 13 is disposed between a gate structure 22 and the isolation 12.

Figure 24:
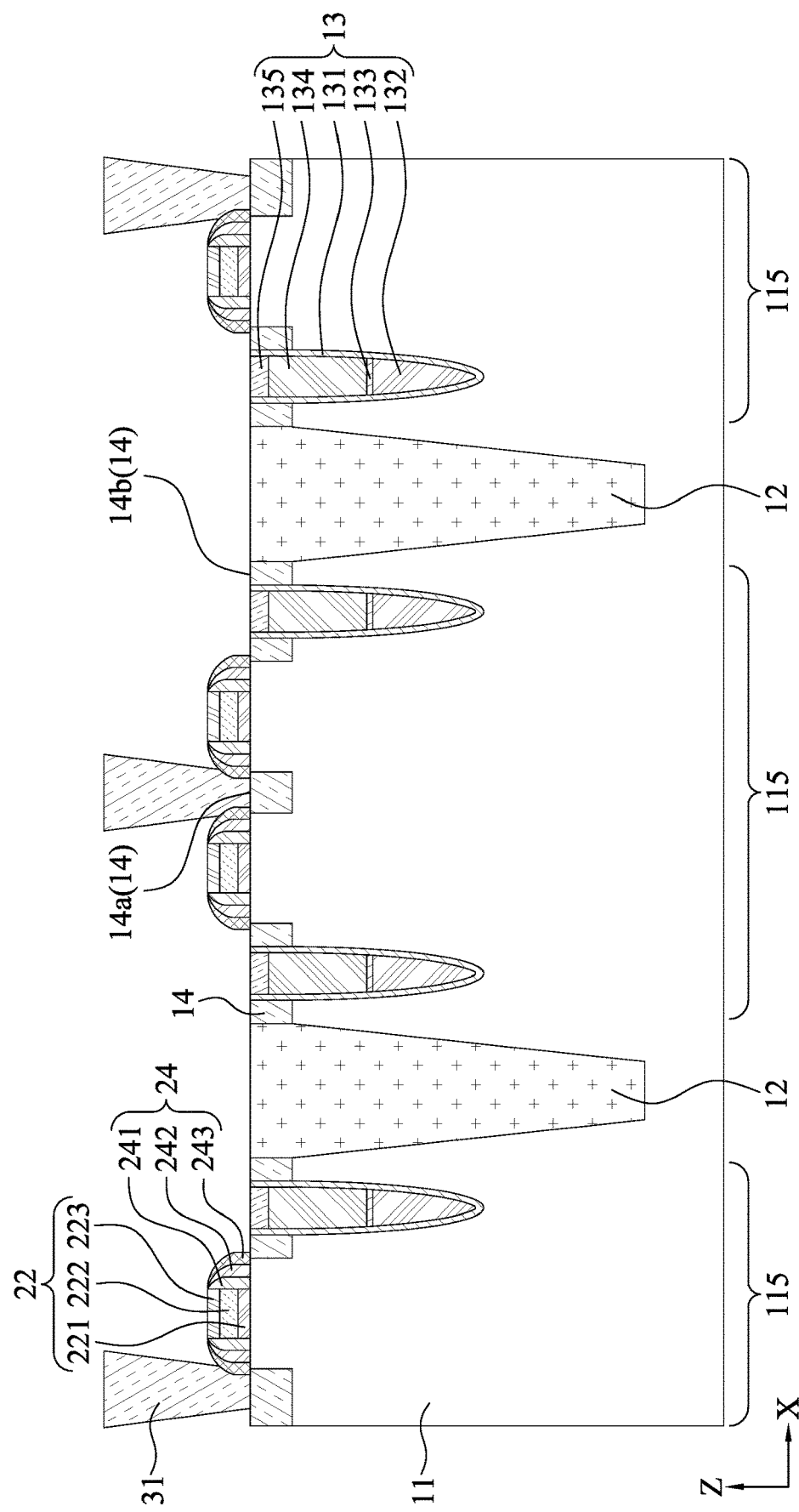

After the operation S13, the method S1 may further include formation of a spacer structure 24 as shown in FIG. 24.

Figure 17:
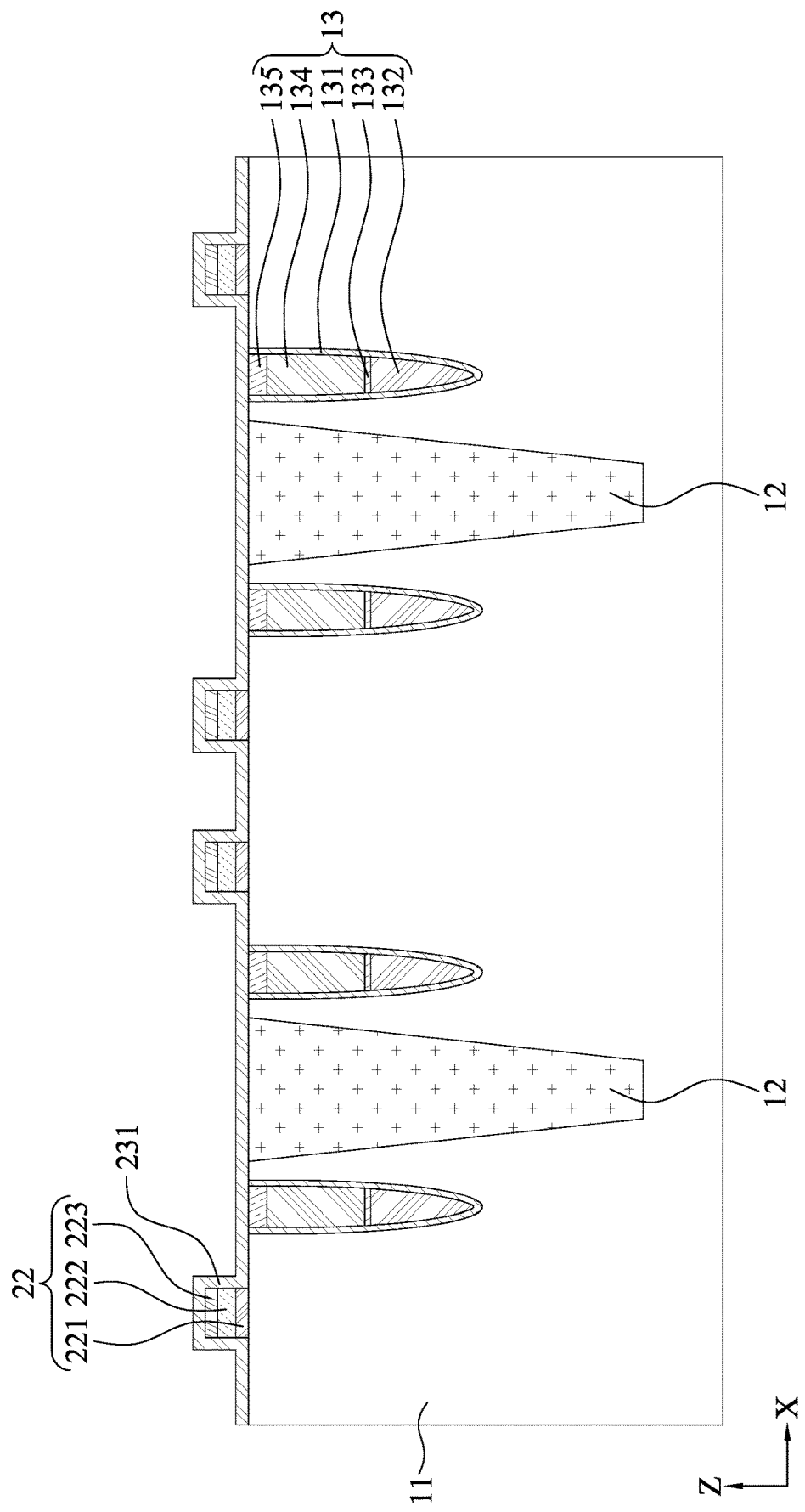

Referring to FIG. 17, FIG. 17 is a schematic cross-sectional diagram along the line A-A' in FIG. 3 in accordance with some embodiments of the present disclosure. The formation of the spacer structure 24 begins with FIG. 17 in which a first dielectric layer 231 is formed over the substrate 11 and the gate structures 22. In some embodiments, the first dielectric layer 231 is formed by a conformal deposition. In some embodiments, the conformal deposition includes CVD, PVD, ALD, LPCVD, PECVD, or a combination thereof. In some embodiments, a profile of the first spacer layer 231 is conformal to a profile of the substrate 11 and the gate structures 22.

Figure 18:
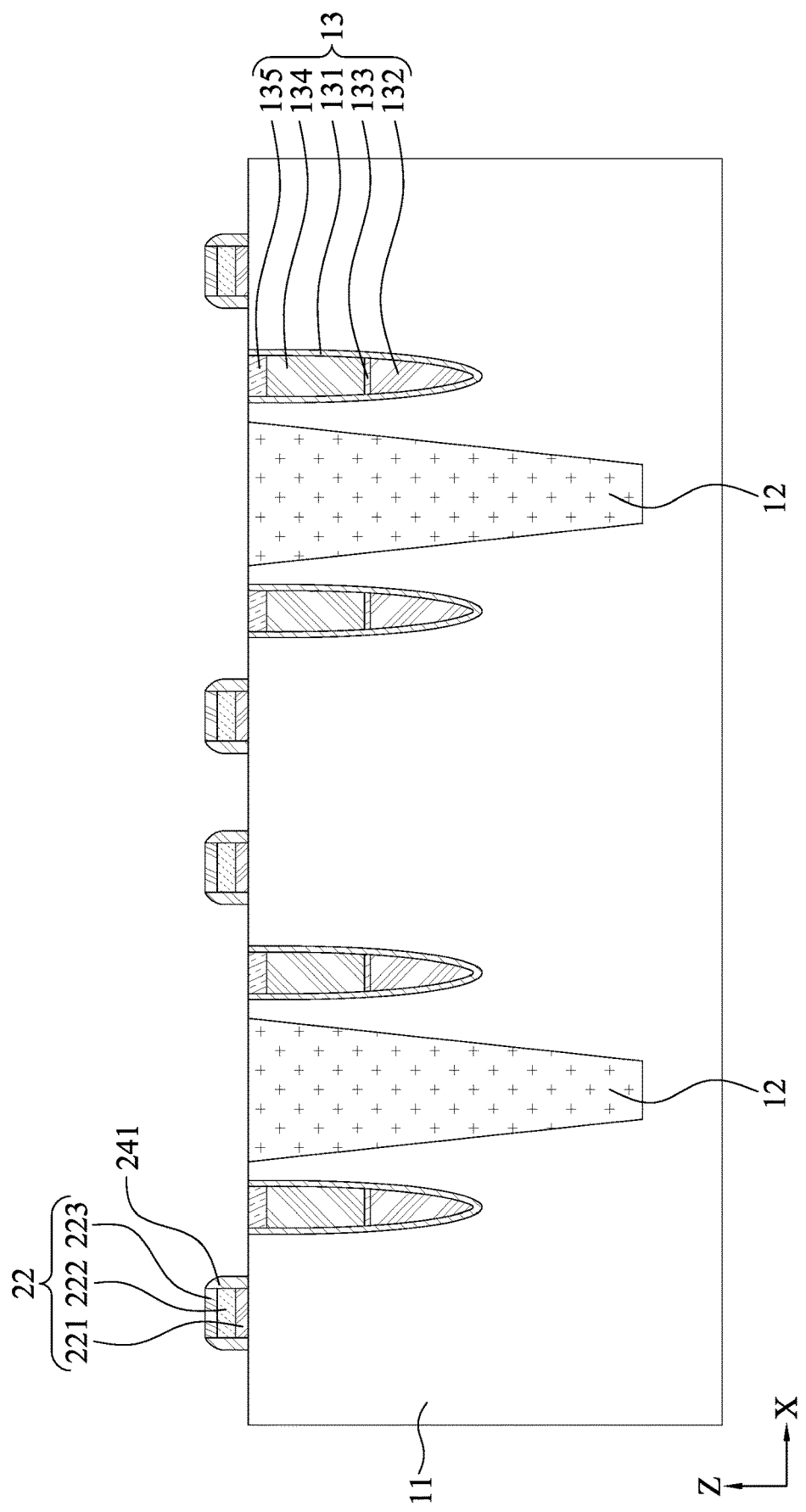

Referring to FIG. 18, FIG. 18 is a schematic cross-sectional diagram along the line A-A' in FIG. 3 in accordance with some embodiments of the present disclosure. A first spacer etching is performed to remove horizontal portions of the first dielectric layer 231, thereby forming a first spacer layer 241 on sidewalls of the gate structures 22. In some embodiments, the first spacer layer 241 includes a rounded top as shown in FIG. 18 due to a property of a spacer etching. In some embodiments, the first spacer layer 241 includes a tip connected to a top corner of the gate structure 22 as shown in FIG. 18. In some embodiments, a thickness of the first spacer layer 241 is substantially equal to the thickness of the first dielectric layer 231.

Figure 19:
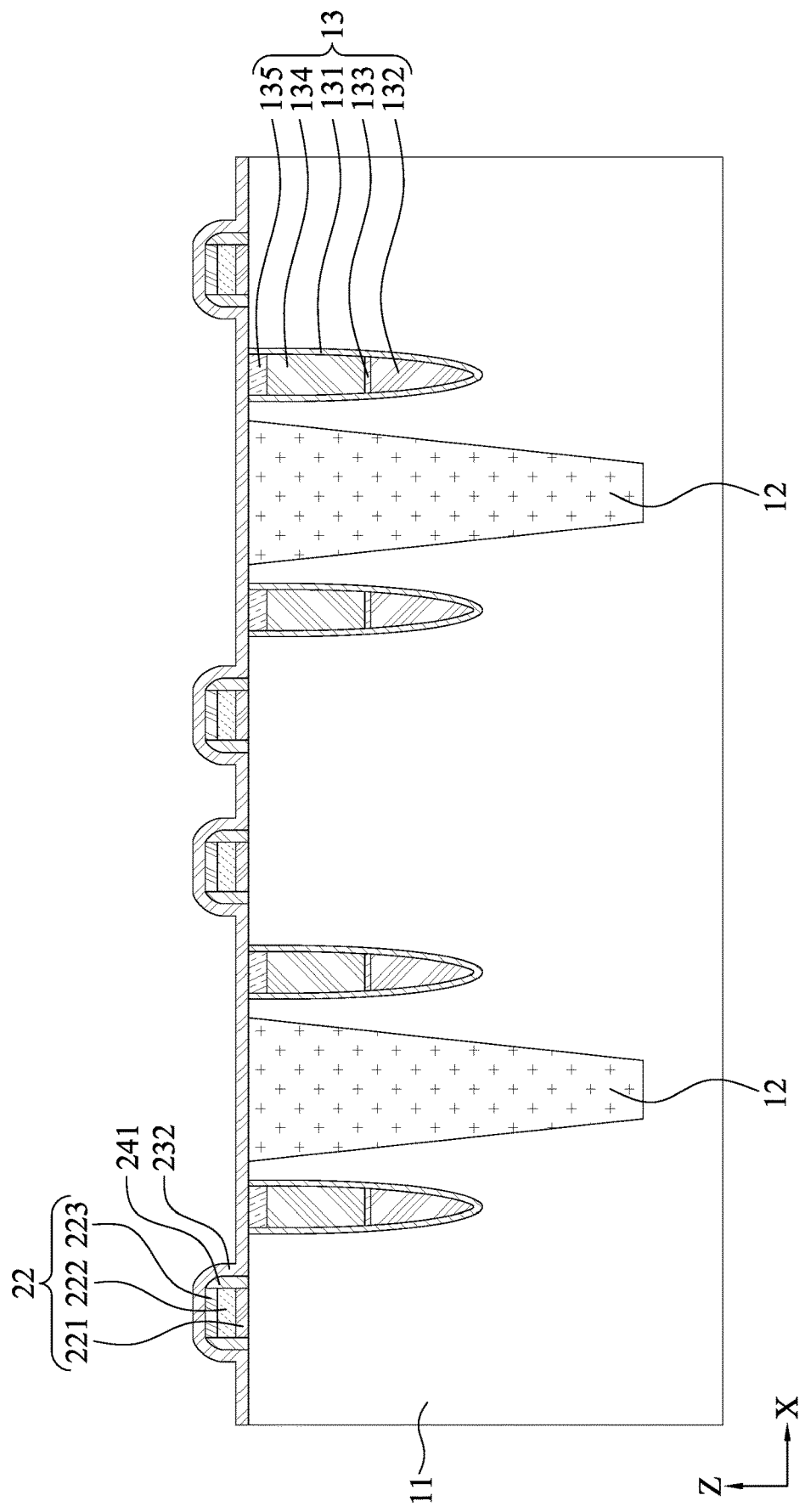

Referring to FIG. 19, FIG. 19 is a schematic cross-sectional diagram along the line A-A' in FIG. 3 in accordance with some embodiments of the present disclosure. A second dielectric layer 232 is formed over the substrate 11, the gate structures 22 and the first spacer layer 241. In some embodiments, the second dielectric layer 23 is formed by a conformal deposition. In some embodiments, the conformal deposition includes CVD, PVD, ALD, LPCVD, PECVD, or a combination thereof. In some embodiments, a profile of the second dielectric layer 232 is conformal to a profile of the substrate 11, the gate structures 22 and the first spacer layer 241. In some embodiments, a thickness of the second dielectric layer 232 is substantially less than the thickness of the first dielectric layer 231.

Figure 20:
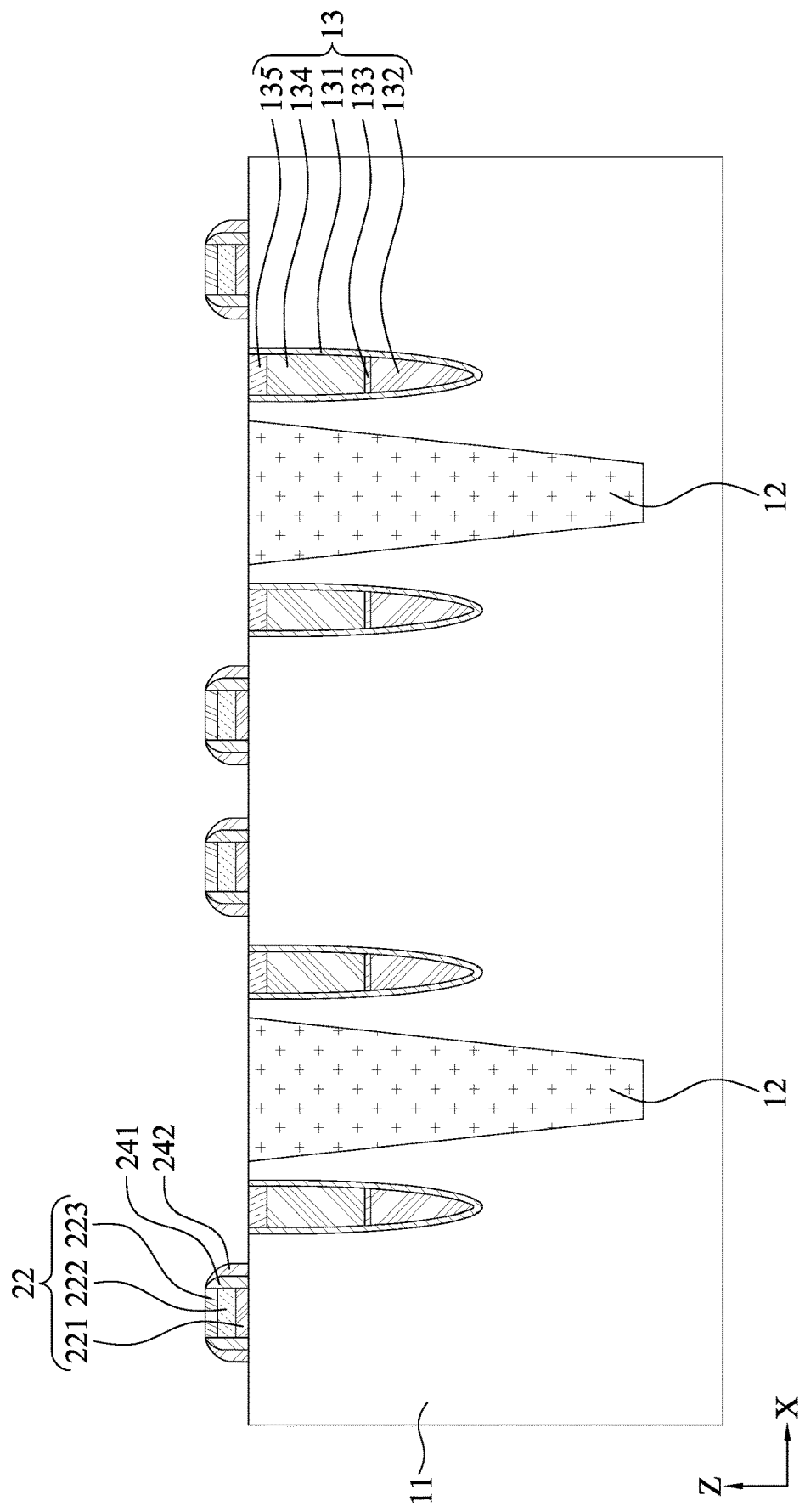

Referring to FIG. 20, FIG. 20 is a schematic cross-sectional diagram along the line A-A' in FIG. 3 in accordance with some embodiments of the present disclosure. A second spacer etching is performed to remove horizontal portions of the second dielectric layer 232, thereby forming a second spacer layer 242 on sidewalls of the gate structures 22 covering the first spacer layer 241. In some embodiments, the second spacer layer 242 includes a rounded top as shown in FIG. 20 due to a property of a spacer etching. In some embodiments, the second spacer layer 242 includes a tip connected to the tip or the rounded top of the first spacer layer 241 as shown in FIG. 20. In some embodiments, a thickness of the second spacer layer 242 is substantially equal to the thickness of the second dielectric layer 232.

Figure 21:
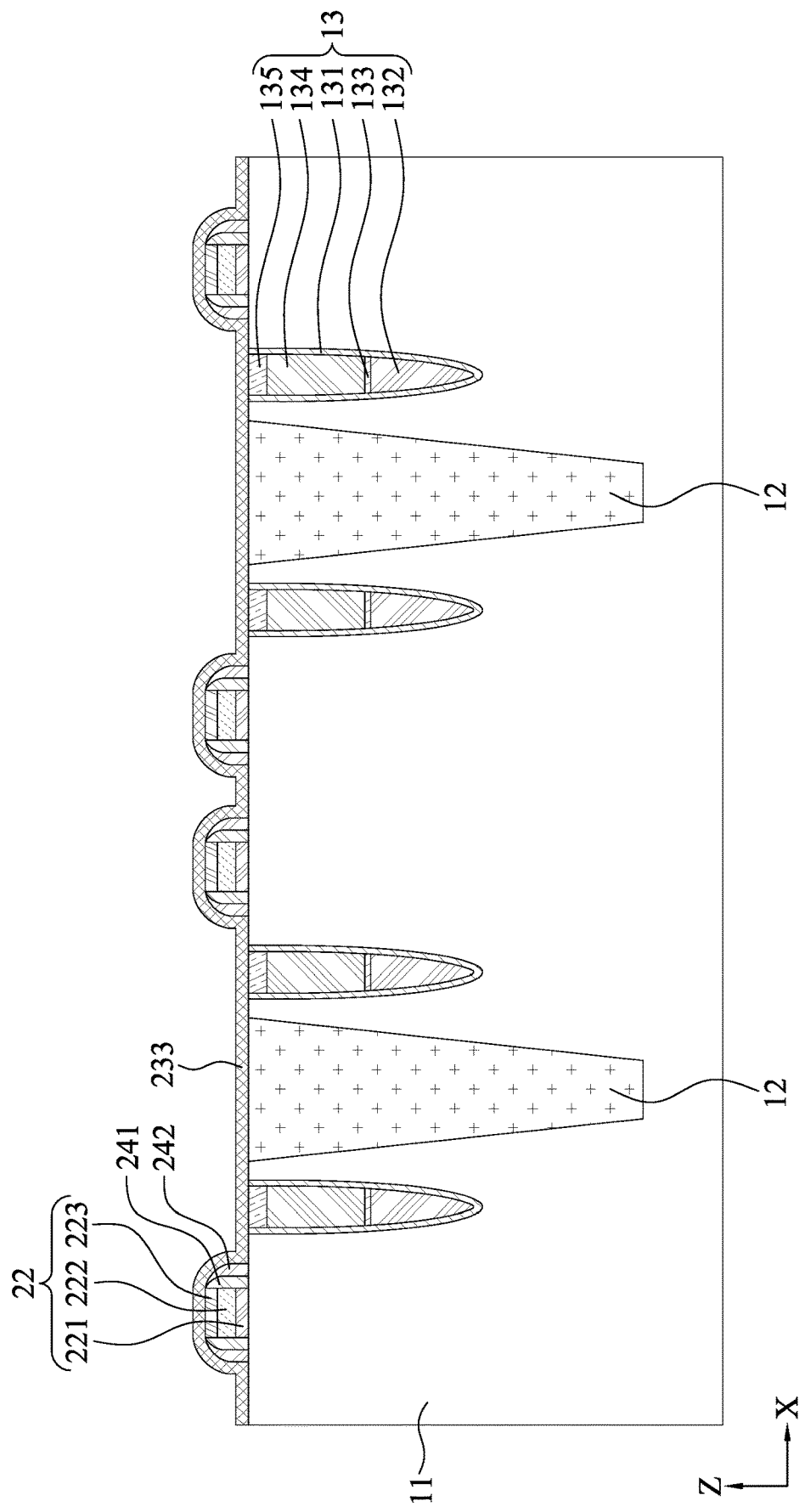

Referring to FIG. 21, FIG. 21 is a schematic cross-sectional diagram along the line A-A' in FIG. 3 in accordance with some embodiments of the present disclosure. A third dielectric layer 233 is formed over the substrate 11, the gate structures 22, the first spacer layer 241 and the second spacer layer 242. The operations as depicted in FIG. 17 can be performed, and repeated description is omitted herein. In some embodiments, a profile of the third dielectric layer 233 is conformal to a profile of the substrate 11, the gate structures 22, and the second spacer layer 242. In some embodiments, a thickness of the third dielectric layer 233 is substantially greater than the thickness of the second dielectric layer 232. In some embodiments, the thickness of the third dielectric layer 233 is substantially equal to the thickness of the first dielectric layer 231.

Figure 22:
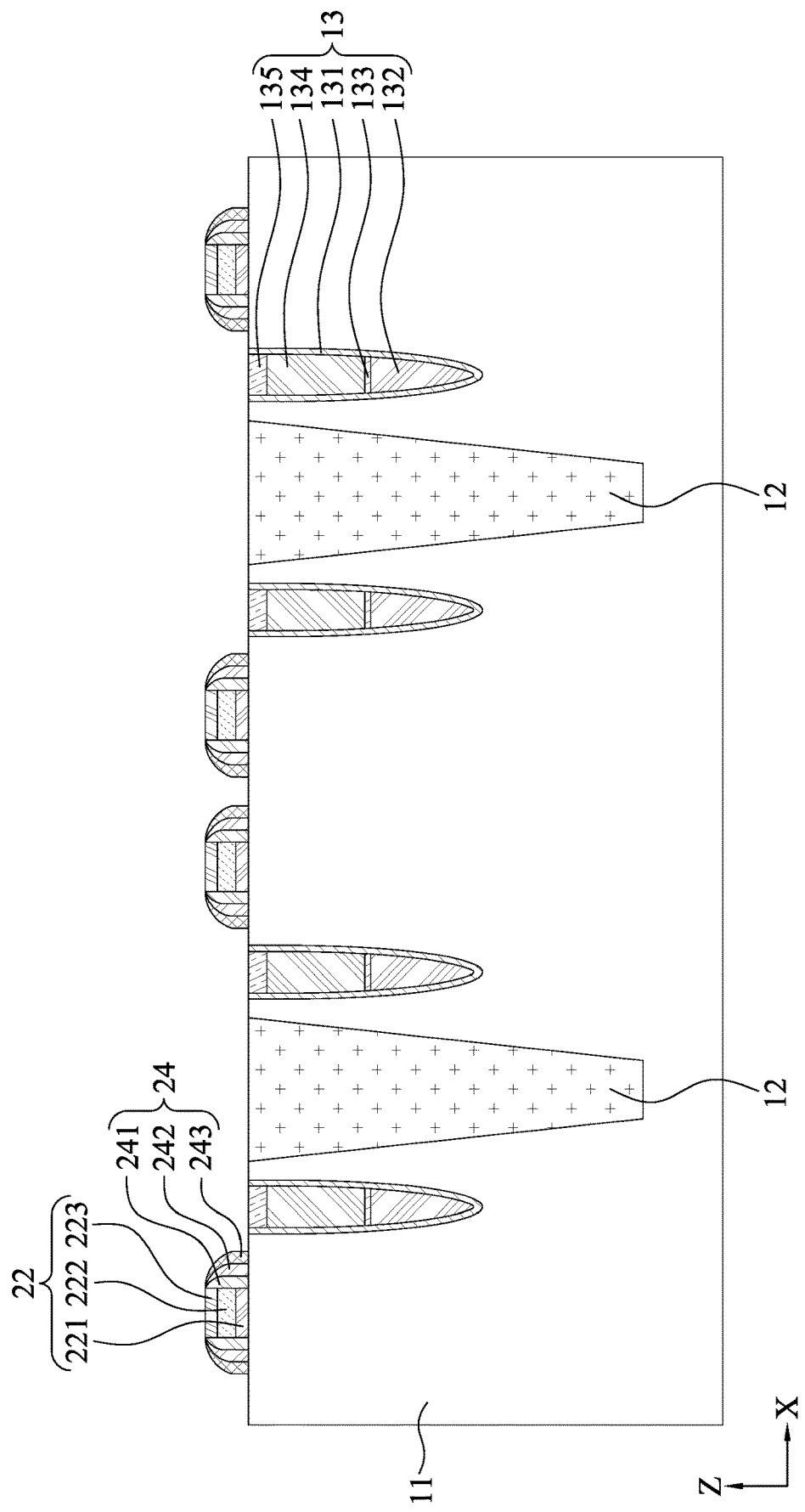

Referring to FIG. 22, FIG. 22 is a schematic cross-sectional diagram along the line A-A' in FIG. 3 in accordance with some embodiments of the present disclosure. A third spacer etching is performed to remove horizontal portions of the third dielectric layer 233, thereby forming a third spacer layer 243 on sidewalls of the gate structures 22 covering the second spacer layer 242. A configuration of the third spacer layer 243 can be similar to that of the first spacer layer 241 or the second spacer layer 242. In some embodiments, a thickness of the third spacer layer 243 is substantially equal to the thickness of the third dielectric layer 233. The first spacer layer 241, the second spacer layer 242 and the third spacer layer 243 together define a spacer structure 24 of the transistor to be formed.

Each of the first spacer layer 241, the second spacer layer 242 and the third spacer layer 243 may include one or more dielectric materials. In some embodiments, the dielectric material includes silicon oxide ($SiO_x$), silicon nitride ($Si_xN_y$), silicon oxynitride (SiON), fluoride-doped silicate (FSG), a low-k dielectric material, a high-k dielectric material, a porous material, other suitable materials, or a combination thereof. The materials of the first spacer layer 241, the second spacer layer 242 and the third spacer layer 243 can be same or different from one another. In some embodiments, adjacent spacer layers of the spacer structure 24 include different dielectric materials. In some embodiments, the first spacer layer 241 and the third spacer layer 243 include a same dielectric material. In some embodiments, the second spacer layer 242 includes silicon oxide, and the first and third spacer layers 241 and 243 include silicon nitride. In some embodiments, the second spacer layer 242 includes silicon nitride, and the first and third spacer layers 241 and 243 include silicon oxide. In some embodiments, a top portion of the second spacer layer 242 is exposed through the third spacer layer 243, and an etch-back operation is performed on the second spacer layer 242 to remove at least a portion of the second spacer layer 242. In some embodiments, the spacer structure 24 includes an air gap (not shown).

Figure 23:
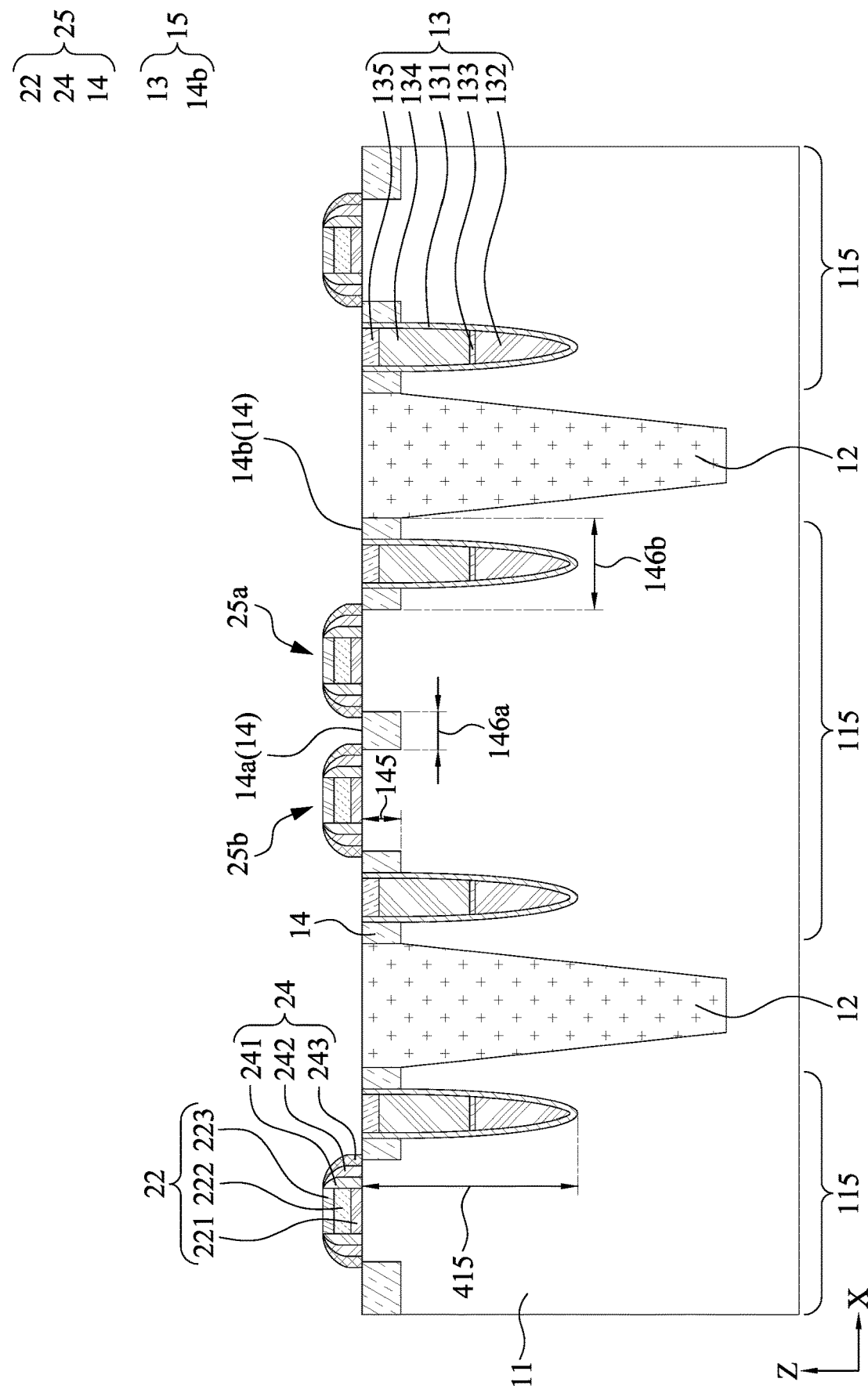

Referring to FIG. 23, FIG. 23 is a schematic cross-sectional diagram along the line A-A' in FIG. 3 in accordance with some embodiments of the present disclosure. The operation S14 is performed, and a doped region 14 is formed in the substrate 11. In some embodiments, the doped region 14 is formed by an implantation or a doping operation on the substrate 11. Dopants are introduced into semiconductor portions (e.g., silicon portions) of the substrate 11 from the top surface 111 of the substrate. In some embodiments, the dopant may be an N-type dopant (or a donor type), such as phosphorus (P), arsenic (As), bismuth (Bi) and arsenic (As). In some embodiments, the dopant may be a P-type dopant (or an acceptor type), such as boron (B), aluminum (Al), gallium (Ga) and indium (In).

In some embodiments, the doped region 14 is formed at the portions of the substrate 11 exposed through the gate structures 22 and the spacer structures 24. In some embodiments, the doped region 14 is formed in the portions of the substrate 11 without overlapping or being covered by the gate structures 22, the spacer structures 24, the trench fuses 13 and the isolation 12. In some embodiments, a thermal activation of the doped region 14 is performed, and the doped region 14 may expand slightly due to diffusion. In some embodiments, a periphery of the doping region 14 is covered by a periphery of the spacer structure 24. In some embodiments, the periphery of the doping region 14 is covered by the third spacer layer 243. In some embodiments, the doping region 14 can be similar to or same as the active area 115 from the top view perspective as shown in FIG. 3. In some embodiments, the doping region 14 surrounds each of the trench fuses 13. In some embodiments, the doping region 14 surrounds each of the gate structures 22 from the top view perspective of FIG. 3. In some embodiments, a depth 144 of the doping region 14 is less than the depth 415 of the trench fuse 13. A plurality of transistors 25 are thereby formed, wherein each of the transistors 25 includes a gate structure 22, a spacer structure 24 and portions of the doping region 14 at two lateral sides of the gate structure 22.

For instance, a transistor 25a is adjacent to a transistor 25b in a same active area 115. Each of a first doping region 14a and a second doping region 14b defines a source/drain (S/D) region of the transistor 25a. In some embodiments, the first doping region 14a is a first S/D region of the transistor 25a disposed between the gate structures 22 of the transistors 25a and 25b, and the second doping region 14b is a second S/D region of the transistor 25b disposed between the gate structure 22 of the transistor 25a and the isolation 12. The first doping region 14a and the second doping region 14b are disposed at two opposite sides of the gate structure 22 of the transistor 25a. In some embodiments, the trench fuse 13 penetrates the second doping region 14b in a cross-sectional view. In some embodiments, a width 146a of the first doping region 14a is different from a width 146b of the second doping region 14b. In some embodiments, the width 146a of the first doping region 14a is less than the width 146b of the second doping region 14b. In some embodiments, the first doping region 14a is a common S/D region of the transistors 25a and 25b. In some embodiments, the transistor 25b is substantially symmetrical to the transistor 25a.

In addition, a trench fuse 13 and an adjacent doping region 14 together define a fuse structure 15. More specifically, the trench fuse 13 and a portion of the second doping region 14b between the gate structure 22 and the trench fuse 13 define the fuse structure 15. Therefore, multiple fuse structures 15 are defined after the formation of the doping region 14.

Referring to FIG. 24, FIG. 24 is a schematic cross-sectional diagram along the line A-A' in FIG. 3 in accordance with some embodiments of the present disclosure. After the operation S14, the method S1 may further include formation of a plurality of contacts 31, and a semiconductor structure 300 is thereby formed. In some embodiments, each of the contacts 31 is disposed in each of the active areas 115 and is upright over the doping region 14. The semiconductor structure 300 may be an exemplary embodiment of the semiconductor structure 200 shown in FIG. 3.

In some embodiments, as shown in FIG. 3, an active area 115 includes one contact 31 disposed between the gate structures 22. Although a distance between the adjacent transistors 25a and 25b can be small due to reduction in dimensions of a device in an advanced generation, the contact 31 can be self-aligned due to the presence of the spacer structures 24, and misalignment of contacts can be avoided.

In some embodiments, the contact 31 is electrically isolated from the gate structure 22 by the spacer structure 24. In some embodiments, the contact 31 is physically separated from the gate structure 22 by the spacer structure 24. In some embodiments, the contact 31 is in physical contact with the spacer structure 24. In some embodiments, the spacer structure 24 defines a distance between the gate structure 22 and the contact 31. In some embodiments, the distance between the gate structure 22 and the contact 31 is substantially equal to a thickness of the spacer structure 24 (i.e., a total thickness of the first spacer layer 241, the second spacer layer 242 and the third spacer layer 243). In some embodiments, the contact 31 electrically connects to the first doping region 14a (i.e., the first S/D region of the transistor 25a or the common S/D region of the transistors 25a and 25b).

Figure 25:
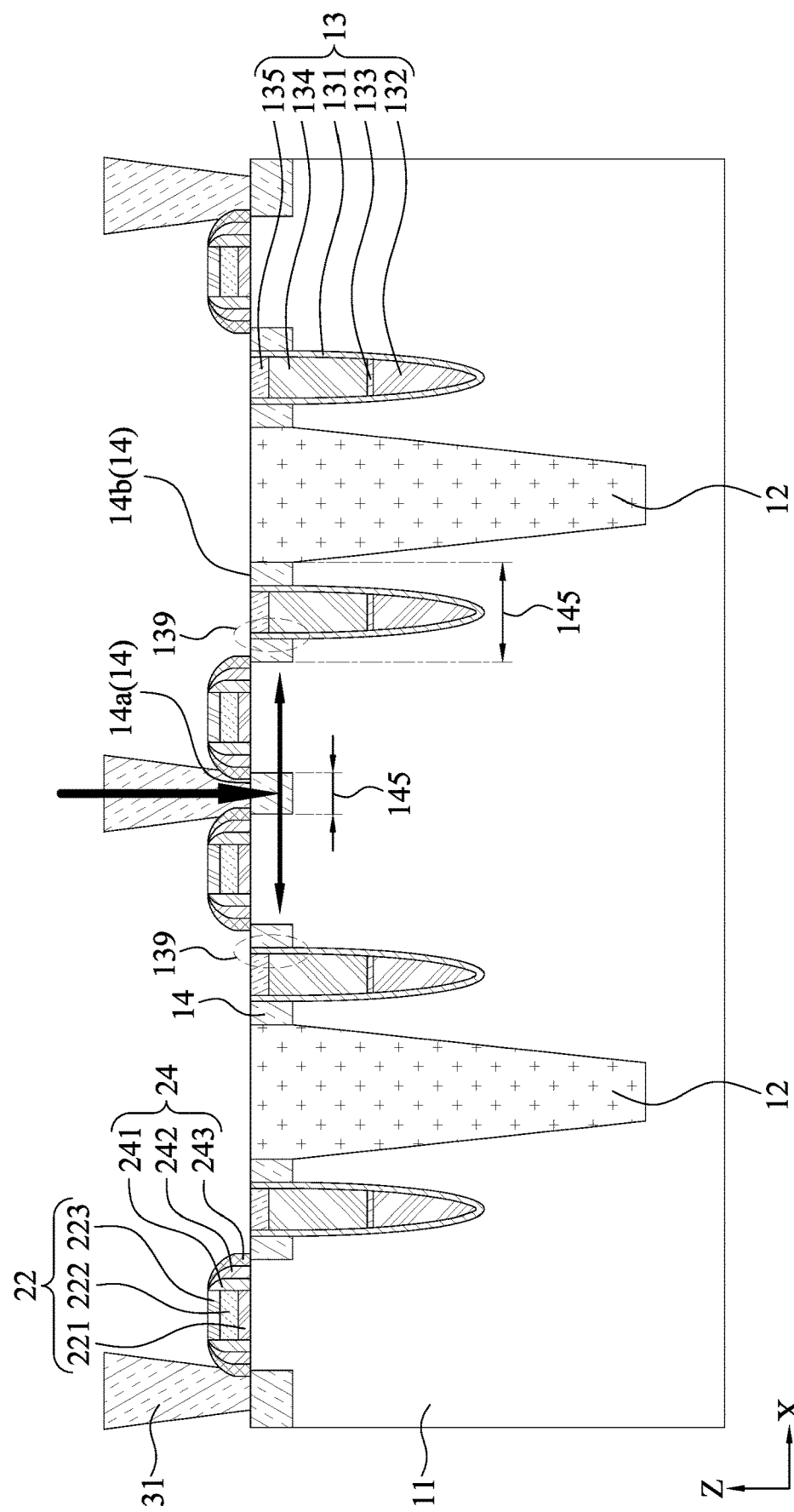
FIG. 25 is a schematic diagram of an operation of a semiconductor structure in accordance with some embodiments of the present disclosure.

Referring to FIG. 25, FIG. 25 is a schematic diagram illustration an operation of the semiconductor structure 300. In some embodiments, a current flux is provided to operate the transistors 25 and the fuse structures 13 through a contact 31, wherein a direction and a pathway of the current is indicated in arrows. During operation of a device (e.g., programming of a memory), the current flux heats up the fuse structure 15, and a portion 139 (circled in dashed lines) of the fuse layer 131 between the doping region 14 and the conductive stack 136 becomes a blown spot 139. Therefore, a traditional device's need for a fuse contact to be formed horizontally adjacent to the gate of a transistor to mitigate a short circuit can be avoided in the present application.

As illustrated above, it is important to maintain a distance between the trench fuse 13 and the spacer structure 24 greater than zero. However, as illustrated in FIG. 7, the distance 417 between the trench 41 (i.e., the fuse trench 13) and the isolation 12 can be zero.

Figure 26:
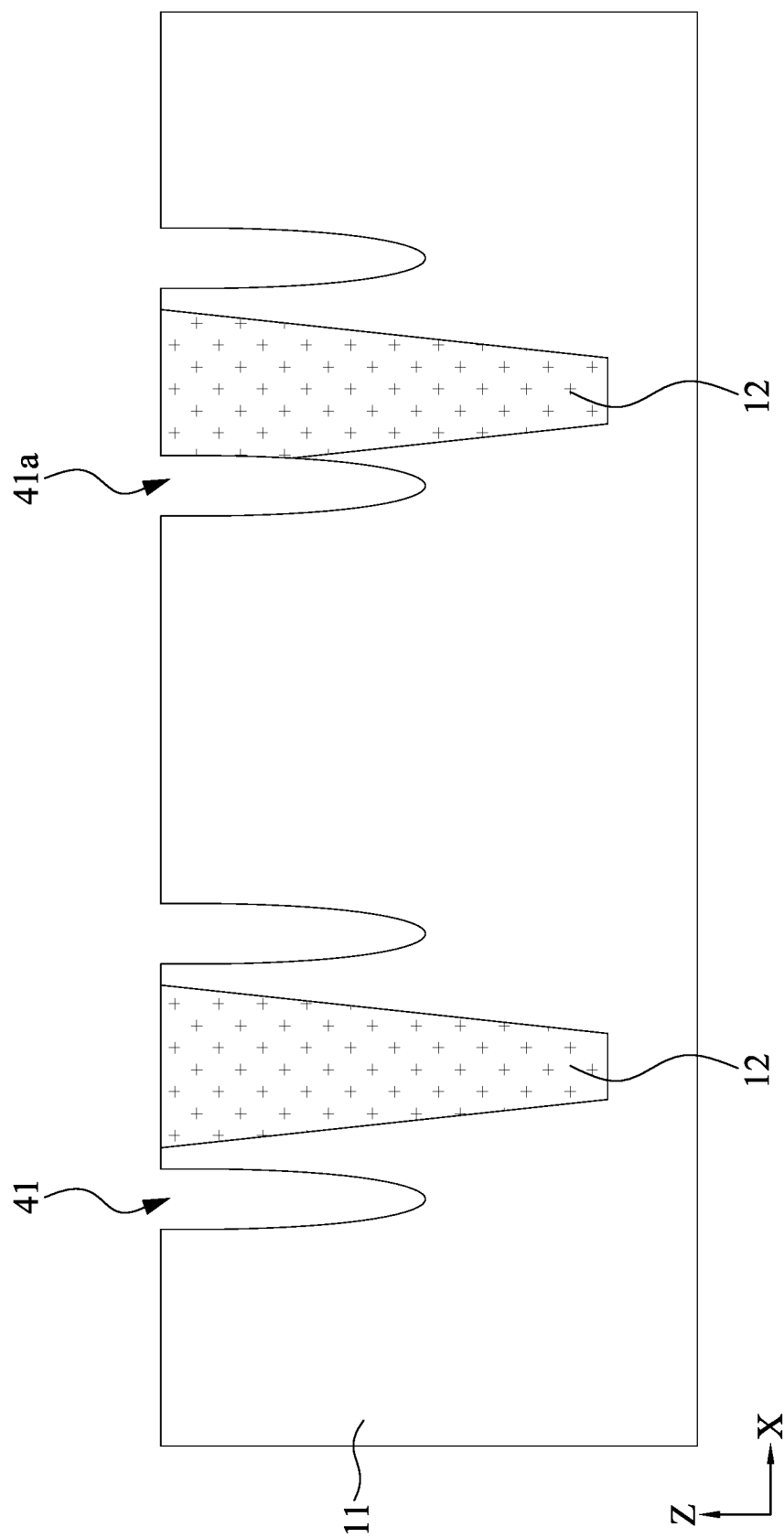
FIGS. 26 to 27 are schematic diagrams illustrating various fabrication stages constructed according to the method of manufacturing a semiconductor structure in accordance with some embodiments of the present disclosure.

Referring to FIG. 26, FIG. 26 is a schematic cross-sectional diagram along the line A-A' in FIG. 3 in accordance with some embodiments of the present disclosure. The operations as depicted in FIGS. 5 to 7 are performed to form an intermediate structure as shown in FIG. 26. A difference between the intermediate structure in FIG. 7 and the intermediate structure in FIG. 26 is that a trench 41a of the plurality of trenches 41 in FIG. 26 is shifted toward the isolation 12. The patterning operation in the formation of the trenches 41 may be less precise, and one or more of the trenches 41 (e.g., the trench 41a) may contact the isolation 12.

Figure 27:
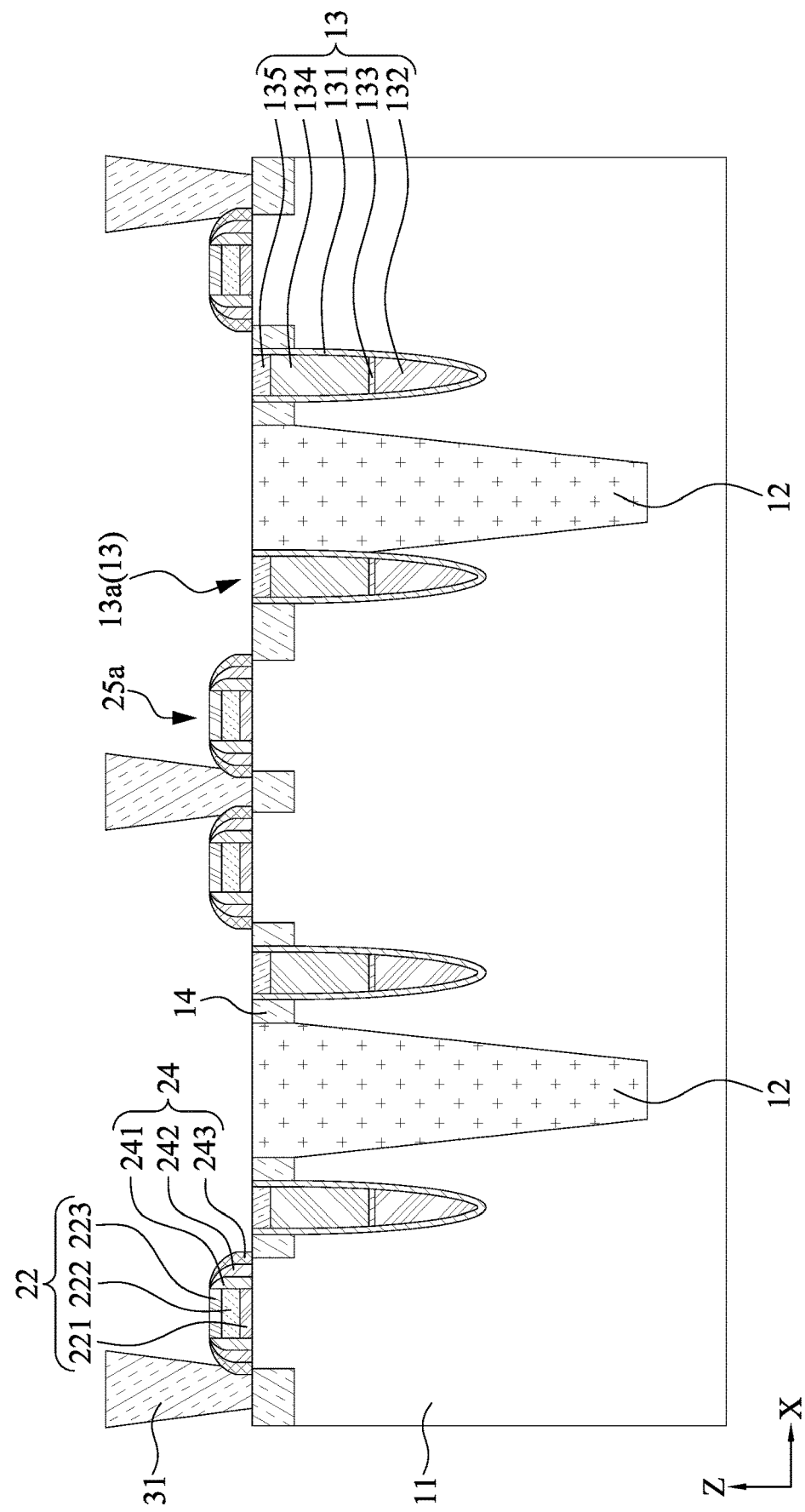

Referring to FIG. 27, FIG. 27 is a schematic cross-sectional diagram along the line A-A' in FIG. 3 in accordance with some embodiments of the present disclosure. The operations as depicted in FIGS. 8 to 24 are performed on the intermediate structure of FIG. 26, and a semiconductor structure 400 as shown in FIG. 27 is formed. In some embodiments, a trench fuse 31a formed in the trench 41a contacts the isolation 12. In some embodiments, a second doping region 14b is formed entirely between a gate structure 22 of a transistor 25a and the trench fuse 13a. Even when a shift or a less precise control of the patterning operation occurs, the device can still normally function as long as the distance 417 in FIG. 7 is greater than the thickness of the spacer structure 24. Thus, a process window and an offset tolerance of the present disclosure are increased compared to the traditional structure. A produce yield can be improved.

One aspect of the present disclosure provides a semiconductor structure. The semiconductor structure includes a substrate; a transistor disposed over the substrate; and a trench fuse disposed in the substrate and penetrating a source/drain (S/D) region of the transistor.

Another aspect of the present disclosure provides a semiconductor structure. The semiconductor structure includes a substrate, including an active area and an isolation surrounding the active area; a transistor, disposed over the substrate and in the active area; and a conductive trench structure, disposed in the substrate and between a gate structure of the transistor and the isolation.

Another aspect of the present disclosure provides a method for manufacturing a semiconductor structure. The method includes a number of operations. A substrate is provided, wherein the substrate includes an active area and an isolation surrounding the active area. A trench fuse is formed in the active area. A gate structure of a transistor is formed over the substrate adjacent to the trench fuse. A doping region is formed surrounding the trench fuse and the gate structure.

In conclusion, the application discloses a manufacturing method of a semiconductor structure and a semiconductor structure thereof. The present disclosure provides a novel structure of a fuse structure formed in a substrate, and may be concurrently formed with a word line structure in a core region. A current flux to the fuse structure can be provided through a contact that stands upright over an S/D region of a transistor adjacent thereto. Therefore, no contact is required above the fuse structure, and short circuit between a fuse contact and an adjacent gate structure, as seen in a traditional structure, can be avoided. In addition, the fuse structure of the present disclosure may include structures similar to the word line structure; and thus, complexity of a manufacturing process can be minimized, and the method of the present disclosure can be effective integrated with traditional manufacturing processes.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A semiconductor structure, comprising:
   a substrate;
   a transistor disposed over the substrate, comprising a first source/drain (S/D) region, a second S/D region, and a gate structure, wherein the first S/D region and the second S/D region are disposed laterally at two opposite sides of the gate structure; and
   a trench fuse disposed in the substrate and penetrating the first S/D region of the transistor;
   wherein the trench fuse comprises:
     an oxide layer lining the substrate;
     a conductive stack surrounded by the oxide layer, wherein the oxide layer is sandwiched between a bottom of the conductive stack and the substrate; and
     a protection layer comprising a dielectric material, wherein the protection layer is formed over the conductive stack, and a top surface of the protection layer is substantially coplanar with a top surface of the substrate.

2. The semiconductor structure of claim 1, wherein the substrate comprises an active area and an isolation surrounding the active area.

3. The semiconductor structure of claim 2, wherein the first S/D region is disposed in the substrate and between the gate structure of the transistor and the isolation.

4. The semiconductor structure of claim 2, wherein the trench fuse is disposed between the isolation and the gate structure of the transistor.

5. The semiconductor structure of claim 2, wherein a distance between the trench fuse and the isolation is in a range of 0 to 60 nanometers.

6. The semiconductor structure of claim 2, wherein a depth of the trench fuse is less than a depth of the isolation.

7. The semiconductor structure of claim 1, wherein a depth of the trench fuse is in a range of 100 to 200 nanometers.

8. The semiconductor structure of claim 1, wherein the conductive stack comprises:
   a metal layer;
   a metallic nitride layer, disposed over the metal layer; and a semiconductive material layer, disposed over the metallic nitride layer.

9. The semiconductor structure of claim 1, wherein the protection layer comprises a silicon nitride layer.

10. The semiconductor structure of claim 1, wherein the gate structure of the transistor comprises a gate dielectric layer, a polysilicon layer and a tungsten layer sequentially arranged over the substrate.

11. The semiconductor structure of claim 1, further comprising: a contact, disposed over the substrate and electrically connected to the second S/D region of the transistor.

12. The semiconductor structure of claim 1, wherein a width of the first S/D region is substantially greater than a width of the second S/D region.

13. A semiconductor structure, comprising:
- a substrate, comprising an active area and an isolation surrounding the active area, wherein the isolation comprises a first dielectric material;
- a transistor, disposed over the substrate and in the active area, comprising a first source/drain (S/D) region, a second S/D region, and a gate structure, wherein the first S/D region and the second S/D region are disposed laterally at two opposite sides of the gate structure; and
- a conductive trench structure, disposed in the substrate and between the gate structure of the transistor and the isolation, wherein the conductive trench structure penetrates the first S/D region;
- wherein the conductive trench structure comprises:
  - a conductive stack comprising a plurality of layers;
  - an oxide layer surrounding the plurality of layers of the conductive stack, wherein the oxide layer is sandwiched between a bottom of the conductive stack and the substrate; and
  - a protection layer comprising a second dielectric material, wherein the protection layer is formed over the conductive stack, and a top surface of the protection layer is substantially coplanar with a top surface of the substrate.

14. The semiconductor structure of claim 13, wherein the conductive trench structure is disposed in a peripheral region of a chip.

15. The semiconductor structure of claim 13, wherein a portion of the oxide layer is surrounded by the first S/D region of the transistor.

16. The semiconductor structure of claim 13, wherein the conductive trench structure is a first conductive trench structure, and the semiconductor structure further comprises a second conductive trench structure disposed adjacent to the transistor opposite to the first conductive trench structure.

17. A method of manufacturing the semiconductor structure of claim 13, the method comprising:
- providing the substrate, comprising the active area and the isolation surrounding the active area;
- forming a conductive trench structure in the active area;
- forming the gate structure of a transistor over the substrate adjacent to the conductive trench structure; and
- forming a doping region surrounding the conductive trench structure and the gate structure, wherein the doping region comprises the first S/D region and the second S/D region.

* * * * *